US010728770B2

(12) United States Patent
Pataky et al.

(10) Patent No.: US 10,728,770 B2
(45) Date of Patent: Jul. 28, 2020

(54) REMOTELY-CONTROLLED DISTRIBUTED ANTENNA SYSTEM FOR RAILROAD TUNNELS EMPLOYING SOFTWARE DEFINED AMPLIFIERS

(71) Applicant: TUNNEL RADIO OF AMERICA, INC., Corvallis, OR (US)

(72) Inventors: Craig S. Pataky, Cottage Grove, OR (US); David L. Wills, Albany, OR (US); William David Chase, Corvallis, OR (US)

(73) Assignee: TUNNEL RADIO OF AMERICA, INC., Corvallis, OR (US)

( * ) Notice: Subject to any disclaimer, the term of this patent is extended or adjusted under 35 U.S.C. 154(b) by 0 days.

(21) Appl. No.: 16/401,063

(22) Filed: May 1, 2019

(65) Prior Publication Data

US 2019/0342765 A1 Nov. 7, 2019

Related U.S. Application Data

(60) Provisional application No. 62/665,420, filed on May 1, 2018.

(51) Int. Cl.

*H03H 11/36* (2006.01)
*H04W 16/26* (2009.01)
*H04W 24/08* (2009.01)
*H03F 3/19* (2006.01)
*B61L 15/00* (2006.01)

(52) U.S. Cl.

CPC ......... *H04W 16/26* (2013.01); *B61L 15/0027* (2013.01); *H03F 3/19* (2013.01); *H04W 24/08* (2013.01); *H03F 2200/451* (2013.01)

(58) Field of Classification Search

CPC . H04W 88/08; H04W 52/367; H04W 72/085; H04W 76/12; H04W 52/0212; H04W 52/325; H04W 52/52; H04B 10/40; H04B 7/0417; H04B 7/0421; H04B 7/15542

See application file for complete search history.

(56) References Cited

U.S. PATENT DOCUMENTS

| | | | | |
|---|---|---|---|---|
| 5,404,570 A | | 4/1995 | Charas et al. | |
| 6,041,216 A | * | 3/2000 | Rose | H04B 1/60 455/523 |
| 2010/0210236 A1 | | 8/2010 | Khemakhem et al. | |
| 2011/0309931 A1 | * | 12/2011 | Rose | E21F 17/18 340/539.13 |
| 2016/0036574 A1 | | 2/2016 | Rose | |
| 2018/0205598 A1 | * | 7/2018 | Kawabata | H04L 49/557 |
| 2019/0280378 A1 | * | 9/2019 | Gears | H01Q 1/246 |

FOREIGN PATENT DOCUMENTS

WO 2017031336 A1 2/2017

OTHER PUBLICATIONS

ISA Korean Intellectual Property Office, International Search Report and Written Opinion Issued in Application No. PCT/US2019/030286, dated Aug. 14, 2019, WIPO, 13 pages.

* cited by examiner

*Primary Examiner* — Tu X Nguyen
(74) *Attorney, Agent, or Firm* — McCoy Russell LLP

(57) ABSTRACT

An amplifier for a radio communications system in a shielded tunnel is disclosed. In one example, the amplifier comprises a processor configured to execute a plurality of modules comprising a gain control module and an attenuation control module. Methods and systems are further provided for controlling and monitoring amplifier characteristics.

18 Claims, 12 Drawing Sheets

200
202
230
102
102
102
222
220
232
234
236
238
240
TX
RX
TX
RX
160
216
214
FII(FIII)
203
204
206
205
218
(FIII)
208
210
FI
212

TMS RF
402
Switch
404
DL Det
422
DL Level
420
406
418
428
TMS RF
402
408
VattnU
Sw Ctrl
VattnU
VattnD
424
DL Level
UL Level
Switching Signal Level
416
410
UL Level
UL Det
412
414
Switch
102
SW Sig Det
426
Switching Signal Level
222

REMOTELY-CONTROLLED DISTRIBUTED ANTENNA SYSTEM FOR RAILROAD TUNNELS EMPLOYING SOFTWARE DEFINED AMPLIFIERS

CROSS REFERENCE TO RELATED APPLICATIONS

The present application claims priority to U.S. Provisional Application No. 62/665,420, entitled "REMOTELY-CONTROLLED DISTRIBUTED ANTENNA SYSTEM FOR RAILROAD TUNNELS EMPLOYING SOFTWARE DEFINED AMPLIFIERS", and filed on May 1, 2018. The entire contents of the above-identified application are hereby incorporated by reference for all purposes.

FIELD

The present description relates generally to communication methods and systems for use in a tunnel, and specifically by railroad trains transiting a tunnel.

BACKGROUND AND SUMMARY

Railroad trains use wireless signals to facilitate continuous monitoring and control of the train. These signals include control signals that are sent from the lead locomotive to support locomotives to control braking and acceleration. The support locomotives are generally spaced apart, separated by multiple railroad cars. In addition, signals are sent between an End-of-Train device and a Head-of-Train device to monitor brake pressure and to ensure that the train is intact. However, these wireless signals, which comprise ultra-high frequency (UHF) radio frequencies, are not reliably transmitted when a train enters a shielded environment, such as a tunnel. A previous solution to this problem uses a distributed antenna system comprising radiating coaxial cable and analog bi-directional, in-line amplifiers to extend radio coverage into railroad tunnels.

The inventors of the present disclosure have identified significant issues with the described tunnel communication system. As an example, set-up, maintenance, and troubleshooting of the tunnel communication system requires the presence of on-site technical personnel both at amplifier locations inside the tunnel, and at a system head end outside the tunnel. Furthermore, adjustments of parameters such as amplifier attenuation, switching power, and gain may also demand on site, manual manipulation of the system within the tunnel. Another issue includes difficulty in gaining access to equipment inside an active railroad tunnel which may demand operational down time of a train track.

The issues may be at least partially addressed by a radio communication system having a remotely-controlled distributed antenna system employing software-defined amplifiers. The software-defined amplifiers (SDAs) described herein provides digital controls and expands monitoring capabilities. The SDA also enables amplifier performance parameters, and, therefore, system performance to be remotely controlled. In addition, the SDA is compatible with existing tunnel communication systems and uses networking technology to send and receive data and therefore may be retrofit to already existing systems. Control and monitoring interfaces may be integrated into system head end apparatuses, and may be made as stand-alone remote devices.

The inventors have also identified and implemented aspects that may be beneficial to technicians in the railroad radio communications systems industry. For example, amplifier gain levels may be set in the field without entering a tunnel. Also, an amplifier switching state, e.g., processing of uplink vs. downlink signals, may be controlled remotely or at the system head end. Additional benefits of the radio communication system include eliminating a pilot signal for setting amplifier gain levels, and an ability to store and manipulate system operation data. Furthermore, the ability to remotely-control both attenuation settings and amplifier uplink/downlink settings is achieved by the radio communication system, described herein.

Advantages provided by the software-defined amplifier of the present disclosure further include an ability to monitor a wide variety of system statuses. For example, gain levels, including both uplink and downlink gain may be monitored either from the system head end or from a remote location through a network connection. Similarly, technicians may monitor power levels, such as peak downlink output power and switching signal RF input power. System parameters, such as RF detector voltages, and attenuation levels, including uplink and downlink attenuator settings, may also be monitored. In addition, system characteristics monitored may include SDA switching state and unit temperature.

SDA unit serial numbers can likewise be monitored so that a technician at the head end or at a remote location may identify and isolate data from each individual SDA. Data from each SDA can be stored in a database for evaluation at a later time. Data from individual SDAs can also be compared to other SDAs in the system or to an ideal SDA performance standard at the time of monitoring, or at a later occasion.

The monitoring and control of SDAs described herein has two levels. A first level comprises on-site monitoring and control at a head end location outside the tunnel. The tunnel may be any shielded environment. Once the system hardware is installed, commissioning, monitoring and control of the system can take place at the head end location, without physical presence of an operator inside of the tunnel. A second level comprises network-enabled monitoring and control. If a network connection is available at the site of the head end, monitoring and control may be performed at any remote site coupled to the network connection. The summary above should be understood as providing an introduction in simplified form to a selection of concepts that are further described in the detailed description. The summary is not meant to identify key or essential features of the claimed subject matter, the scope of which is defined uniquely by the claims that follow the detailed description. Furthermore, the claimed subject matter is not limited to implementations that solve any disadvantages noted above or in any part of the present disclosure.

DETAILED DESCRIPTION

The following description relates to systems and methods for a radio communications system for railroad tunnels comprising a remotely-controlled distributed antenna system employing software-defined amplifiers. The software defined amplifiers (SDAs) enable remote and on-site monitoring and control of the radio communications system. In one example, monitoring of the radio communications system includes the monitoring of downlink and uplink power levels, including peak downlink output power. Uplink and downlink gain levels, and uplink and downlink RF detector voltages may be monitored as well. Monitoring capabilities further include the ability to monitor downlink and uplink attenuator settings, SDA switching state, switching signal power levels, and downlink and uplink noise floors. Monitoring may also include SDA unit serial numbers and temperatures.

In addition, in one embodiment, control capability includes controlling downlink and uplink gain levels, downlink and uplink attenuator settings, and amplifier downlink/uplink settings. Control capability may also include controlling a system gain balance procedure from a system head end. Monitoring and control may take place on-site at the head end location outside the tunnel, or performed remotely through a network connection. In addition to the ability to monitor and control the SDAs, the radio communications system of the present disclosure enables remote and on-site presetting of executable instructions, tuning, and diagnosis of the SDAs.

Figure 1:
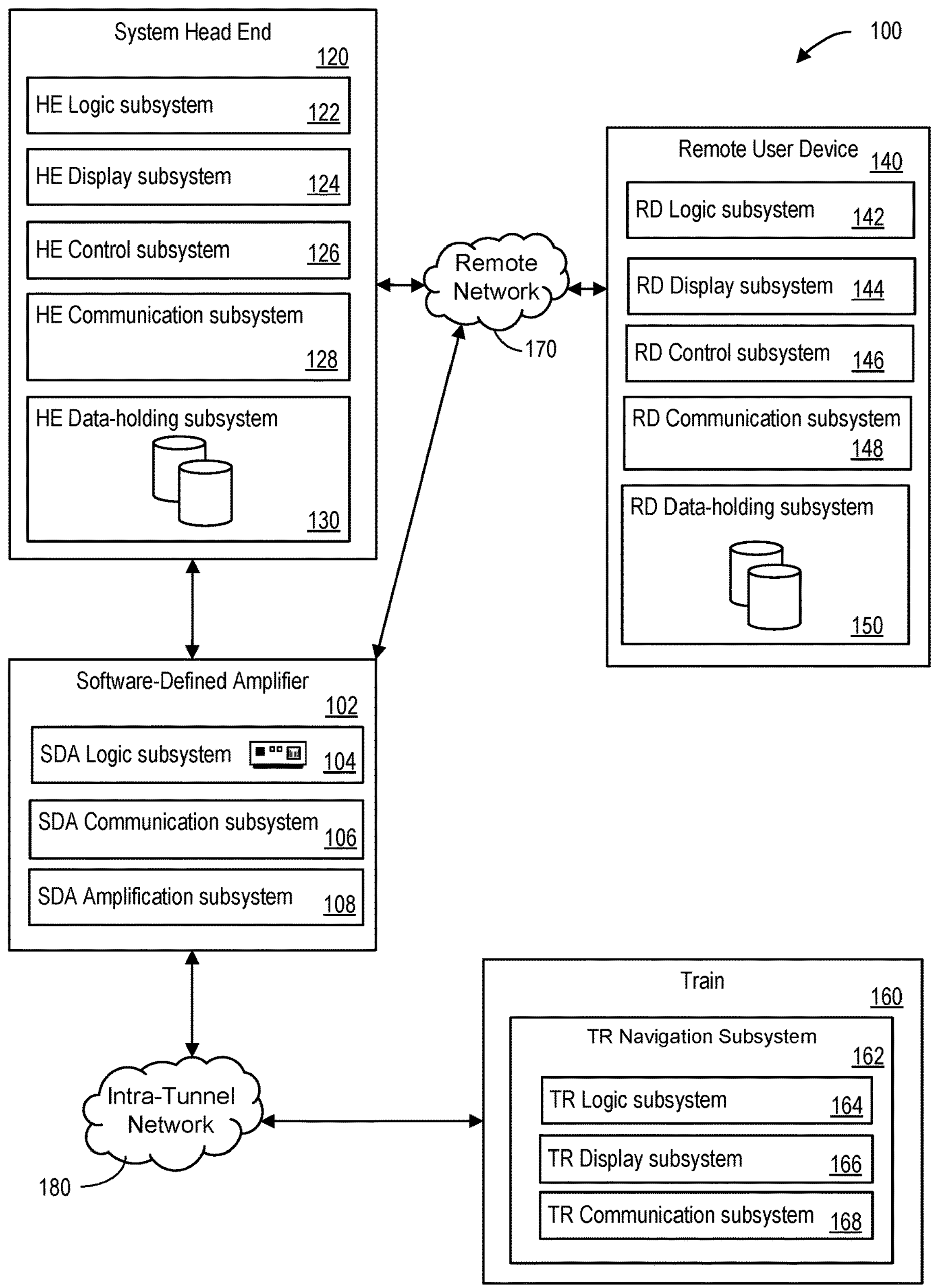
FIG. 1 is a schematic diagram of the tunnel monitoring system of the present disclosure.

Referring now to FIG. 1, a schematic is provided which depicts generally components of radio communications system 100. The schematic shows components of a radio communications system 100 that may interact by sending and receiving information from other components. Radio communications system 100 may include components, described further below, implemented by software on a device such as a computer or system controller. The information may be digital information, but may also include analog information. Radio communications system 100 includes at least one software-defined amplifier (SDA) 102.

Software may be defined as a set of instructions or data used to operate devices such as computers. Software may include applications, programs, and scripts that run on a device, unlike, for example, hardware which encompasses physical components of computers. Both executable code, such as binary values defining processor values, and non-executable data, such as digital media, may be included in software. Thus, SDA 102 may be operated and controlled based on software configured to provide instructions for SDA 102 operations.

SDA 102 may be an electronic amplifier configured to intensify a low-power signal without degrading a signal-to-noise ratio. A power of the signal is increased by SDA 102 while impeding introduction of additional noise to the signal. Use of amplifiers in radio communication systems may offset loss of signal during transmission through a feed line, such as a coaxial cable.

The SDA 102 includes an SDA logic subsystem 104 that may include one or more physical devices configured to execute one or more instructions. For example, SDA logic subsystem 104 may be configured to execute one or more instructions that are part of one or more applications, services, programs, routines, libraries, objects, components, data structures, or other logical constructs. Such instructions may be implemented to perform a task, transform the state of one or more devices, or otherwise arrive at a desired result.

SDA logic subsystem 104 may include one or more microcontrollers or processors that are configured to execute preset instructions. A microcontroller may be a self-contained system with one or more processors, a tangible non-transitory memory, and peripherals. Additionally or alternatively, the SDA logic subsystem 104 may include one or more hardware or firmware logic machines configured to execute hardware or firmware instructions. Processors of the SDA logic subsystem 104 may be single or multi-core, and the instructions and algorithms executed thereon may be configured for parallel or distributed processing. The SDA logic subsystem 104 may optionally include individual components that are distributed throughout two or more devices, which may be remotely located and/or configured for coordinated processing. One or more aspects of the SDA logic subsystem 104 may be virtualized and executed by remotely accessible networked computing devices, including devices configured in a cloud computing configuration.

The SDA logic subsystem 104 may include software applications in addition to firmware. The SDA logic subsystem 104 may decode information received from a system head end 120, from a remote user device 140, or from a train 160. The SDA logic subsystem 104 may also encode information sent to other components of radio communications system 100. The SDA logic subsystem 104 may comprise one or multiple computer-related languages including machine languages and programming languages.

Figure 8:
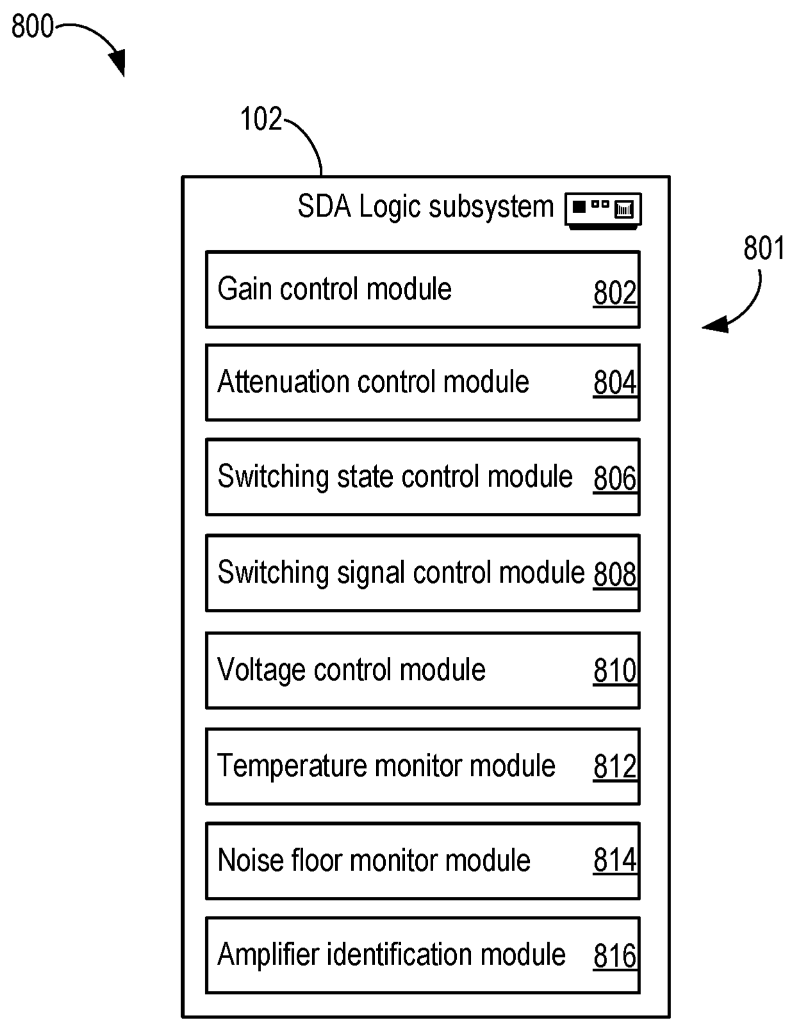
FIG. 8 is a schematic diagram of a logic subsystem of an SDA depicting a plurality of modules that may be used to adjust operating parameters of the SDA.

For example, the software applications may be implemented amongst a plurality of modules 801 of the SDA logic subsystem 104 providing instructions for adjusting operating parameters of the SDA 102, as shown in a schematic block diagram 800 of the SDA logic subsystem 104 in FIG. 8. As used herein, the term "module" may include a computer processor, controller, or other logic-based device that performs operations based on instructions stored on a tangible and non-transitory computer readable storage medium, such as a computer memory. Thus, each of the plurality of modules 801 may include a hard-wired device that performs operations based on hard-wired logic of the device. The plurality of modules 801 may each represent hardware and associated instructions (e.g., software stored on a tangible and non-transitory computer readable storage medium, such as a computer hard drive, ROM, RAM, or the like) that perform one or more operations described herein. The hardware may include electronic circuits that include and/or are connected to one or more logic-based devices, such as microprocessors, processors, controllers, or the like.

Examples of methods for each of the plurality modules 801 are shown in FIGS. 6-7 and 9-15. It will be appreciated that while the methods shown may compare operating parameters to corresponding thresholds or preset levels, other examples may include adjusting the operating parameters based on commanded levels or levels adjusted by an operator and input into a system head end, such as the system head end 120 of FIG. 1, and transmitted to the SDA 102.

Figure 6:
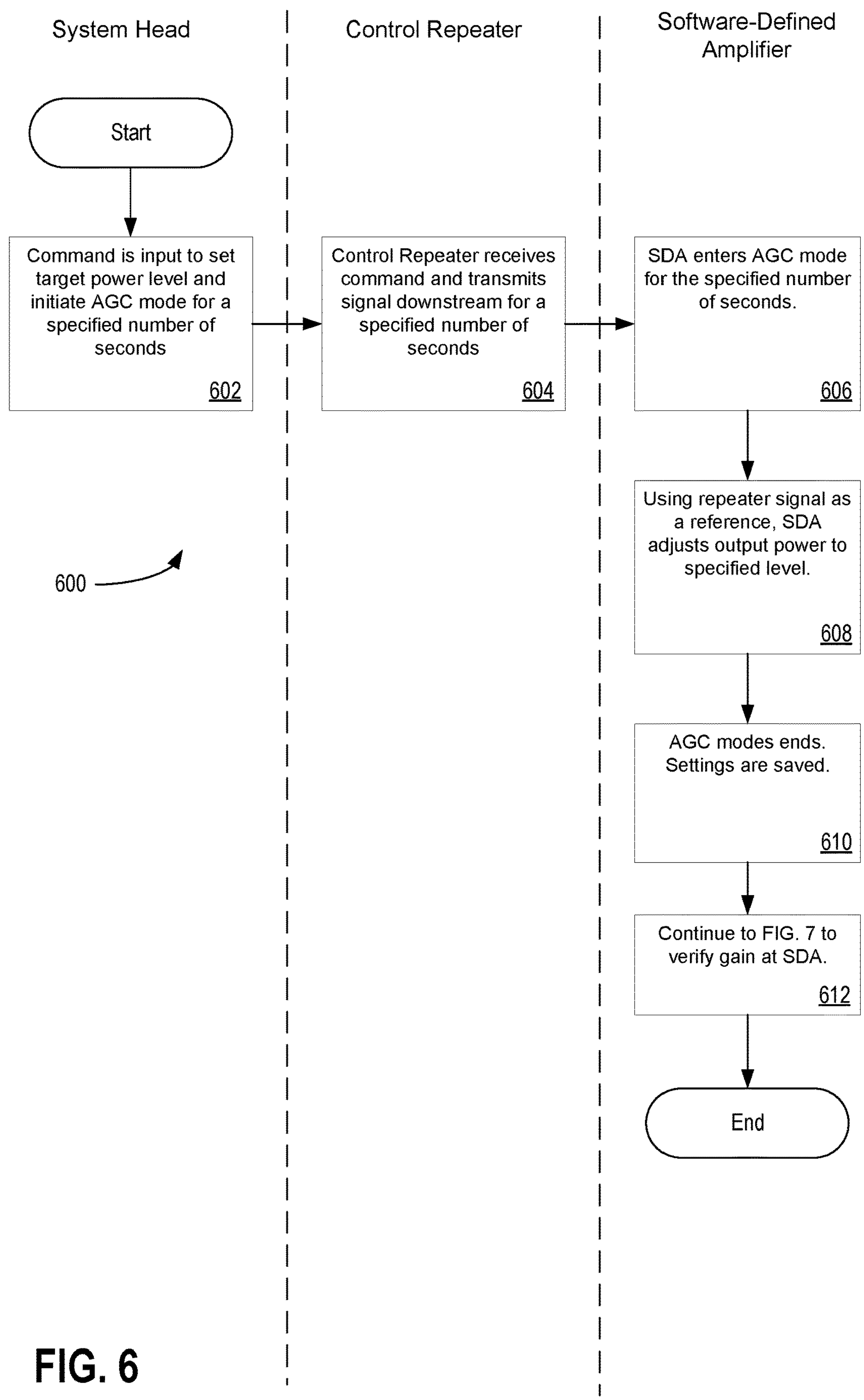
FIG. 6 is a method diagram depicting a process of setting an SDA gain level.
Figure 7:
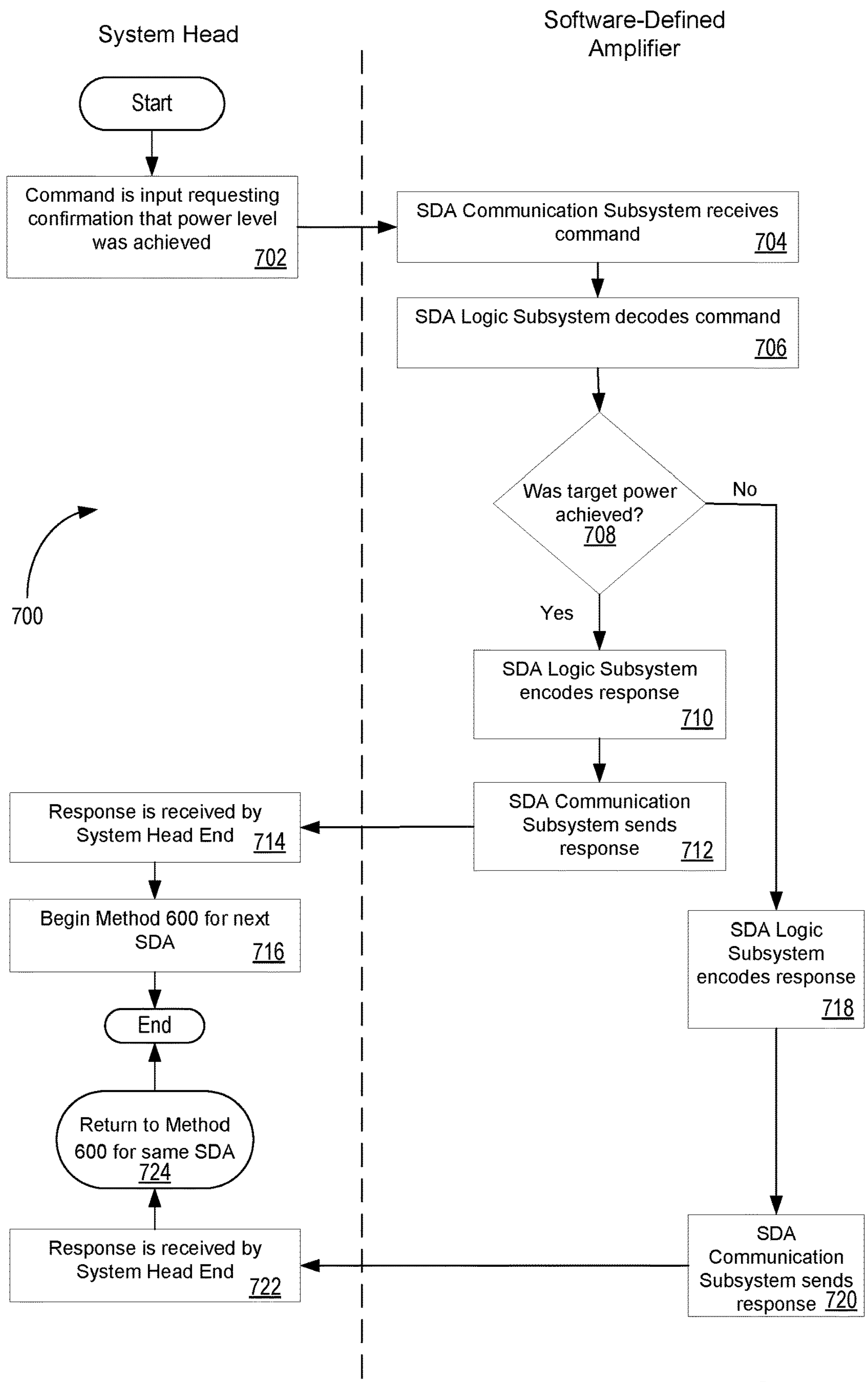
FIG. 7 is a method diagram depicting a process of checking an SDA gain level.

The plurality of modules 801 of the SDA logic subsystem 104 may include a gain control module 802. Gain is a ratio of output power to input power in an electrical network, e.g., a ratio of signal power delivered to SDA 102 to signal power output of SDA 102. The system gain may be adjusted based on a desired signal intensity to be transmitted and/or a tolerance of components of the radio communication system. Thus the gain control module 802 may query a current gain level at the SDA 102, compare the gain level to a target gain level, and adjust the gain accordingly. Examples of methods for controlling and confirming the gain level of the SDA 102 are shown in FIGS. 6 and 7 and described further below.

Figure 4:
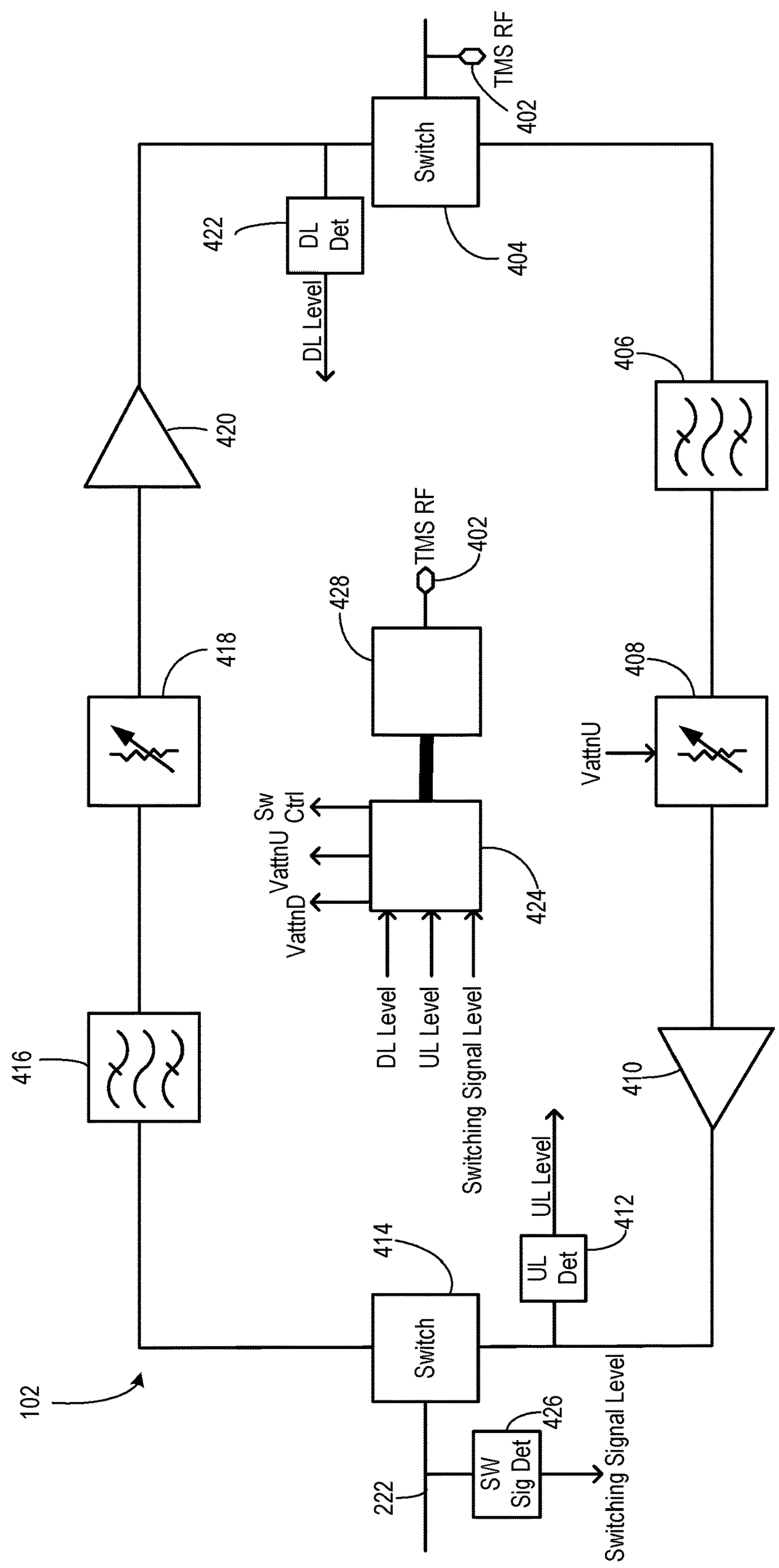
FIG. 4 is a block diagram of an SDA.

Similarly, an attenuation of the SDA 102 may be varied based on an attenuation control module 804. The SDA 102 may include one or more attenuators, as shown in FIG. 4 and described further below. The attenuators may be electronic devices that reduce a power of a signal without distorting a waveform of the signal, used to weaken a high level output of a signal generator. For example, a resistance of the attenuators may be varied to regulate attenuation of the signal. A current level of attenuation of the SDA 102 may be reported by the attenuation control module 804 and adjusted to a target level by the attenuation control module 804.

Figure 9:
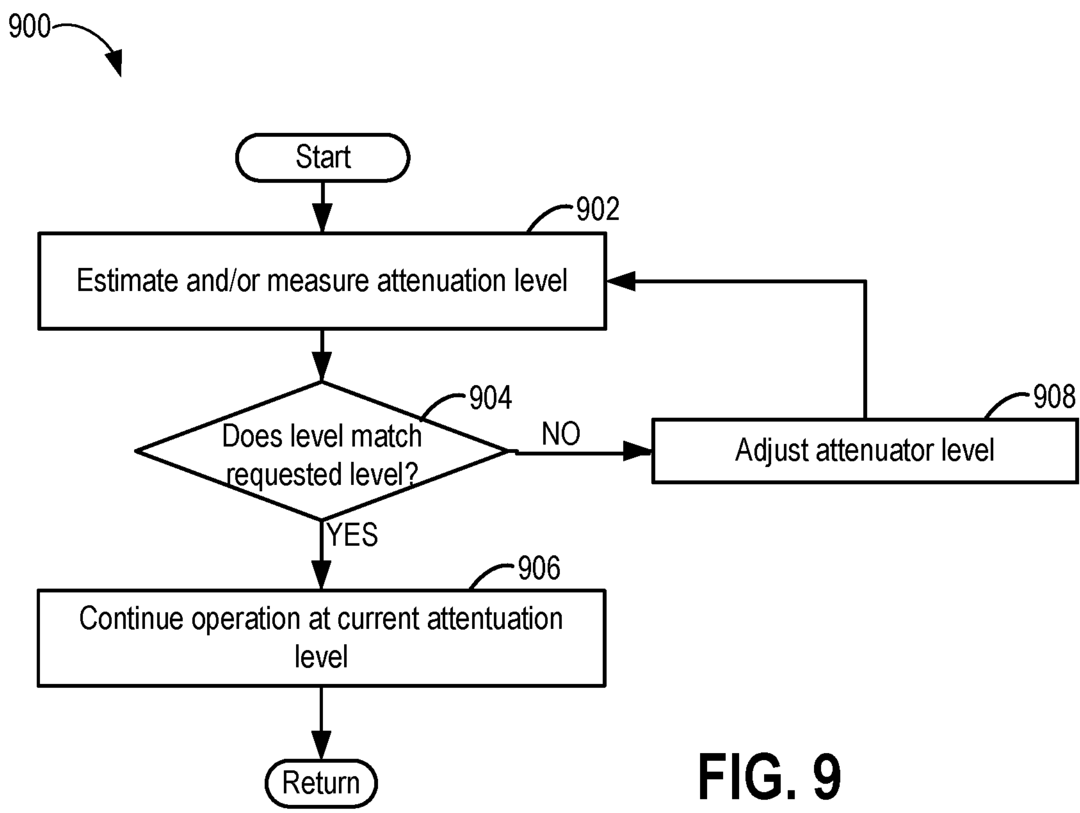
FIG. 9 is an example of a method for controlling SDA attenuation.

An example of a method 900 for adjusting an attenuation level of the SDA 102 is shown in FIG. 9. Method 900 may be implemented by an SDA microcontroller and includes, at 902, determining the attenuation level at attenuators of the SDA. The attenuation level may be estimated or measured, for example, by measuring a resistance at the attenuators. At 904, the method includes comparing the measured attenuation level to a requested attenuation level. The requested attenuation level may be a preset level stored in a memory of the SDA microcontroller or a command sent from a system head end, such as the system head end 120 of FIG. 1. If the attenuation level matches the requested level, the method proceeds to 906 to continue SDA operation at the current attenuation level. If the attenuation level does not match the requested level, the method continues to 908 to adjust the attenuation level via the attenuation control module 804 of FIG. 8. The method returns to 902 to estimate and/or measure the attenuation level.

The plurality of modules 801 may further include a switching state control module 806 and a switching signal control module 808. The switching state control module 806 may receive information from one or more switches of the SDA 102, as shown in FIG. 4, and report a status of the one or more switches, e.g., whether the switch is active and receiving/transmitting a signal, indicating a path of signal transmission. The activity of the one or more switches may also be controlled by the switching state control module 806. The switching signal control module 808 may monitor a power level of the one or more switches, as measured by one or more signal detectors as shown in FIG. 4, and report a current power level of the one or more switches as well as adjust the power level of the one or more switches to a target power level.

Figure 10:
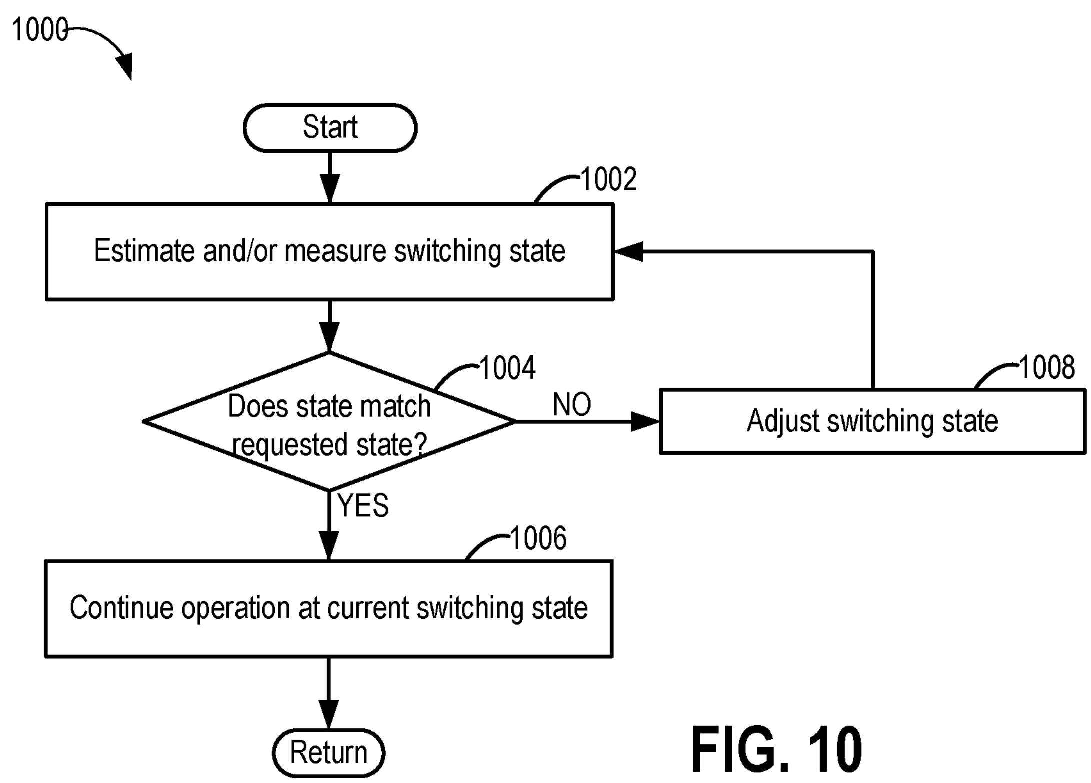
FIG. 10 is an example of a method for controlling SDA switching state.

An example of a method 1000 for adjusting a switching state of the SDA 102 is shown in FIG. 10. Method 1000 may be implemented by an SDA microcontroller and includes, at 1002, determining the switching state of the SDA 102. The switching state may be evaluated based on information received from one or more switches of the SDA 102 regarding an activity of the one or more switches. At 1004, the method includes comparing the switching state to a requested switching state, e.g., which switch is active/non-active, a direction or status of signal transmission, etc. The requested switching state may be a preset state or configuration stored in a memory of the SDA microcontroller or a command sent from a system head end, such as the system head end 120 of FIG. 1. If the switching state matches the requested switching state, the method proceeds to 1006 to continue SDA operation with the current switching state. If the switching state does not match the requested level, the method continues to 1008 to adjust the switching state via the switching state control module 806 of FIG. 8. The method returns to 1002 to estimate and/or measure the switching state.

Figure 11:
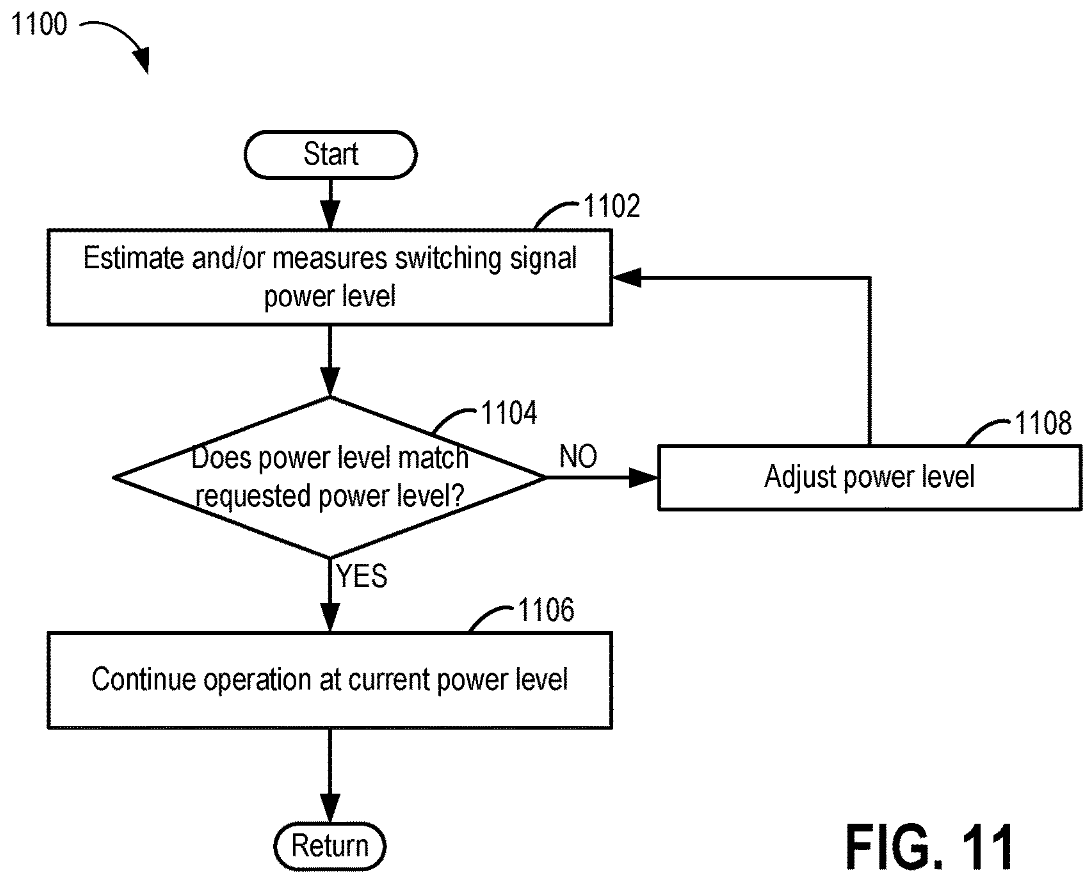
FIG. 11 is an example of a method for controlling SDA switching signal power.

An example of a method 1100 for adjusting a switching signal power level of the SDA 102 is shown in FIG. 11. Method 1100 may be implemented by an SDA microcontroller and includes, at 1102, determining the switching signal power level of the SDA 102 at one or more SDA switches. The switching signal power level may be determined, for example, by measuring power level at one or more signal detectors of the SDA 102. At 1104, the method includes comparing the measured switching signal power level to a requested switching signal power level. The requested switching signal power level may be a preset power level stored in a memory of the SDA microcontroller or a command sent from a system head end, such as the system head end 120 of FIG. 1. If the switching signal power level matches the requested power level, the method proceeds to 1106 to continue SDA operation at the current switching signal power level. If the switching signal power level does not match the requested level, the method continues to 1108 to adjust the switching signal power level via the switching signal control module 808 of FIG. 8. The method returns to 902 to estimate and/or measure the switching signal power level.

A voltage of the SDA 102 may be monitored and adjusted by a voltage control module 810 receiving information from a voltage detector of the SDA 102. The plurality of modules 801 may also include a temperature monitoring module 812 to monitor and report a temperature of the SDA 102 as determined by a temperature sensor at the SDA 102, a noise floor monitoring module 814, as well as an amplifier identification module 816. The noise floor monitoring module 814 may report an inferred noise floor based on reception of signals other than a target signal. The noise floor may be a sum of all noise sources, e.g., signals separate from the target signal that may interfere with reception and transmission of the target signal at SDA 102. The noise floor may be determined based on a set of algorithms stored in a memory of the noise floor monitoring module 814. The amplifier identification module 816 may associate a set of reported/monitored parameters, as determined by plurality of module 801, with a specific SDA 102 when more than one SDA 102 is included. The amplifier identification module 816 may store information regarding, for example, serial numbers of each SDA 102 and assign received information to each SDA 102 according to identity.

Figure 12:
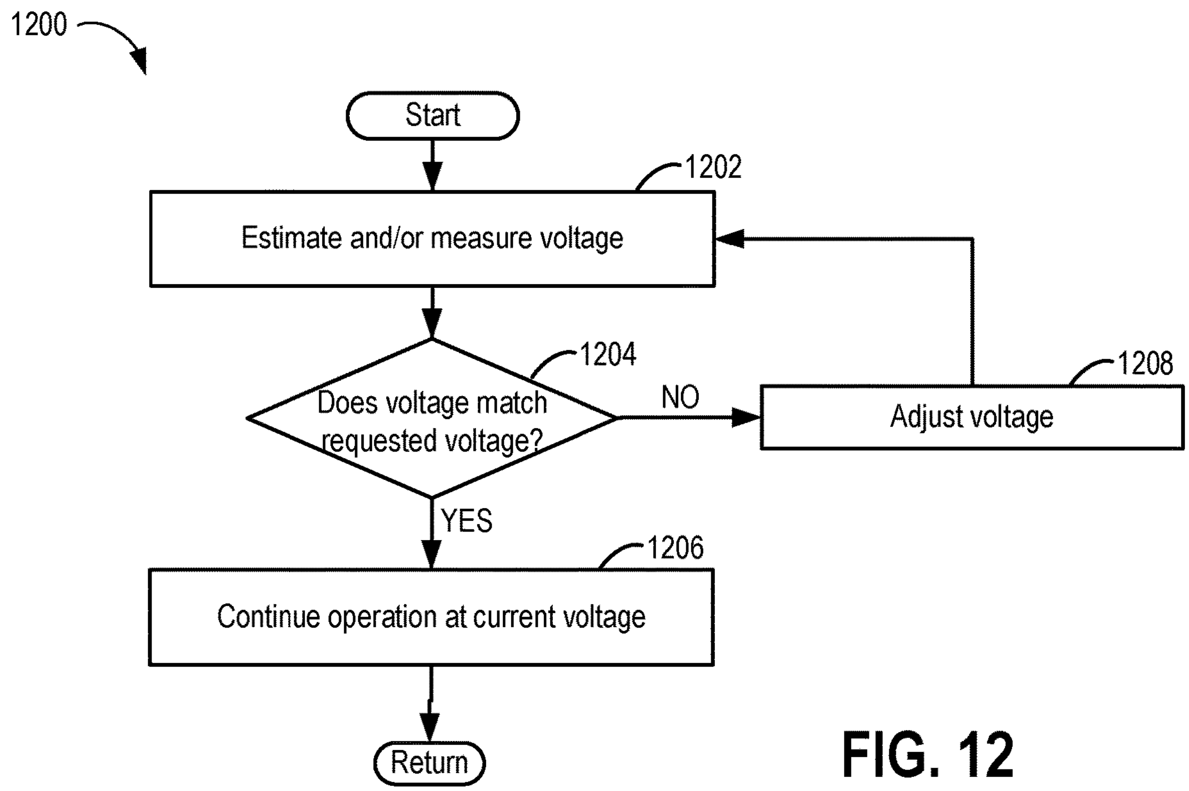
FIG. 12 is an example of a method for controlling SDA voltage.

An example of a method 1200 for adjusting a voltage of the SDA 102 is shown in FIG. 12. Method 1200 may be implemented by an SDA microcontroller and includes, at 1202, determining the voltage of the SDA 102. The voltage may be determined, for example, by a voltage detector arranged in the SDA 102. At 1204, the method includes comparing the measured voltage to a requested voltage. The requested voltage may be a preset voltage stored in a memory of the SDA microcontroller or a command sent from a system head end, such as the system head end 120 of FIG. 1. If the voltage matches the requested voltage, the method proceeds to 1206 to continue SDA operation at the current voltage. If the voltage does not match the requested level, the method continues to 1208 to adjust the voltage via the voltage control module 810 of FIG. 8. The method returns to 1202 to estimate and/or measure the voltage.

Figure 13:
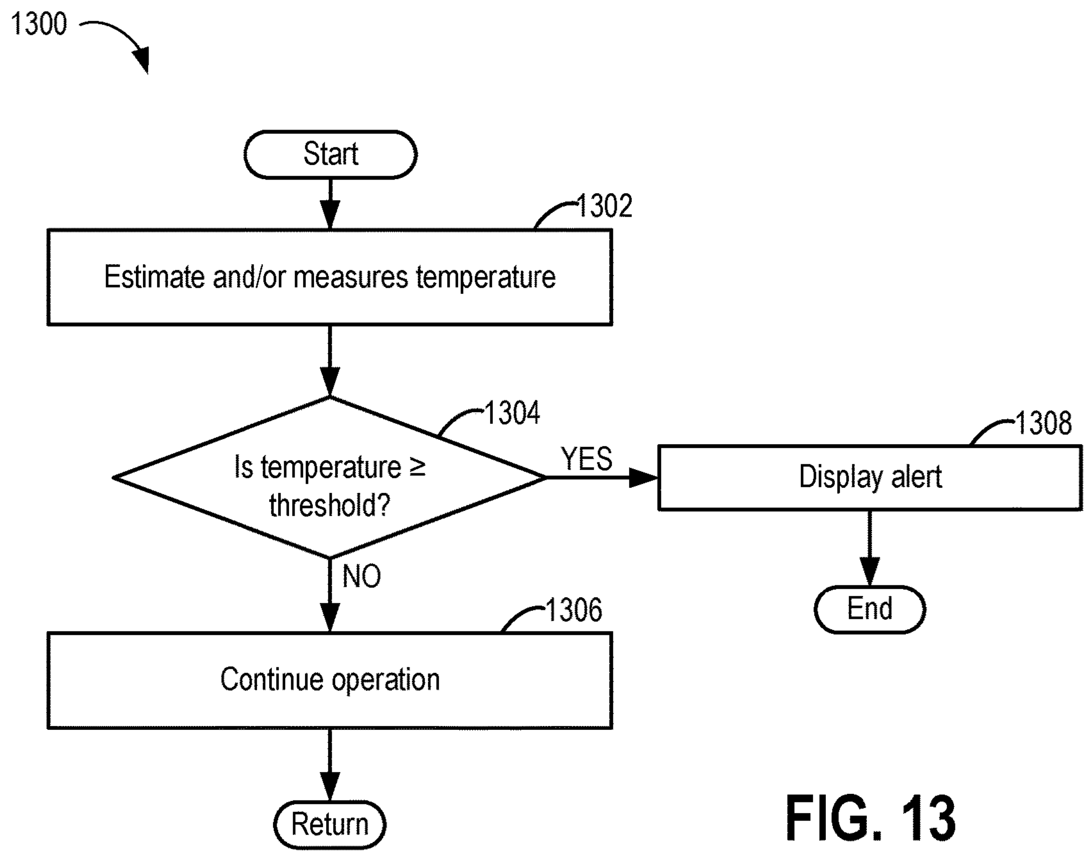
FIG. 13 is an example of a method for monitoring and reporting SDA temperature.

An example of a method 1300 for monitoring a temperature of the SDA 102 by the temperature monitor module 812 of FIG. 8 is shown in FIG. 13. Method 1300 may be implemented by an SDA microcontroller and includes, at 1302, determining the temperature of the SDA 102. The temperature may be determined, for example, by a temperature sensor arranged in the SDA 102. At 1304, the method includes comparing the measured temperature to a threshold temperature. The threshold temperature may be maximum heat tolerance of the SDA 102, stored in a memory of the SDA microcontroller. Alternatively, the threshold temperature may be a preset temperature level input by an operator at a system head end. If the threshold temperature does not reach the threshold temperature, the method proceeds to 1306 to continue SDA operation at the current temperature. If the temperature does reach or exceed the threshold, the method continues to 1308 to display an alert on a user interface, such as a screen or monitor at a system head end or a remote user device. In some examples, operation of the SDA 102 may be suspended until mitigating actions are performed.

Figure 14:
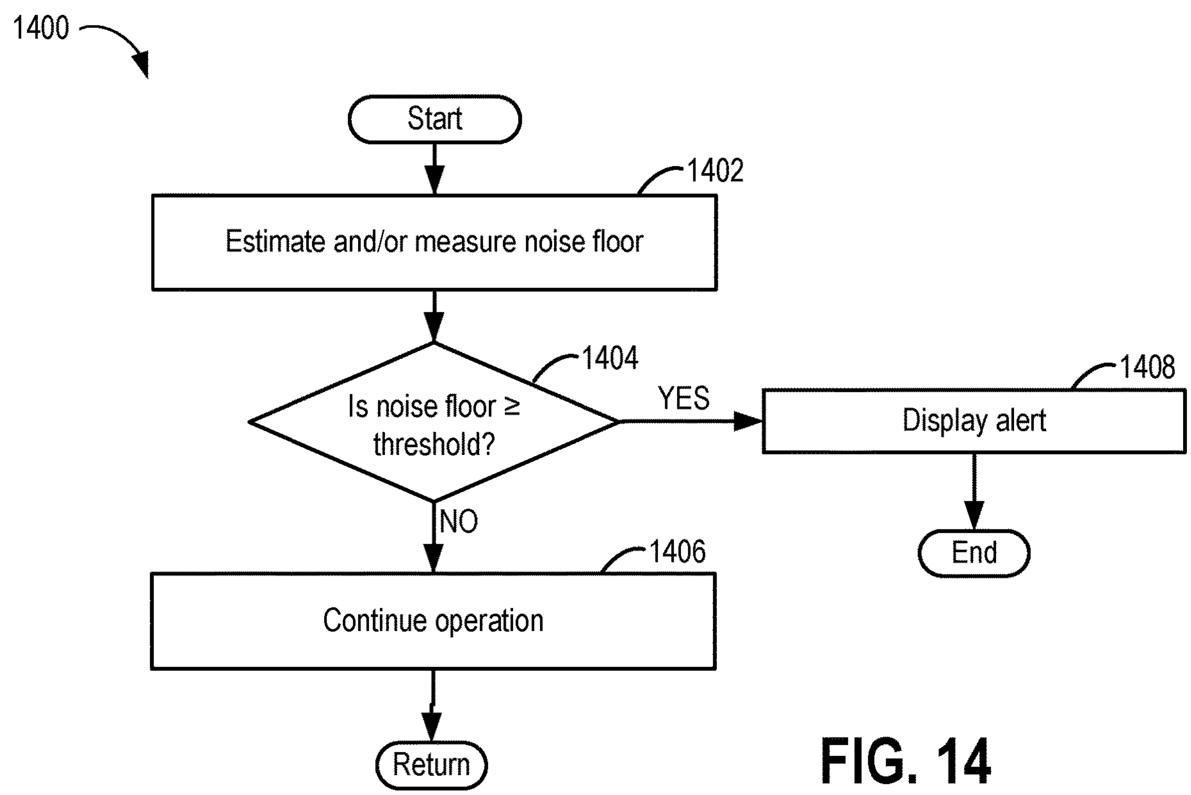
FIG. 14 is an example of a method for monitoring and reporting SDA noise floor.

An example of a method 1400 for monitoring a noise floor of the SDA 102 by the noise floor module 814 of FIG. 8 is shown in FIG. 14. Method 1400 may be implemented by an SDA microcontroller and includes, at 1402, determining or inferring the noise floor of the SDA 102. The noise floor may be determined, for example, via calculating a sum of signals, e.g., noise, other than a target signal to be amplified and transmitted, received at the SDA 102. At 1404, the method includes comparing the inferred noise floor to a threshold noise floor. The threshold noise floor may be a noise floor level above a signal-to-noise to ratio where it becomes challenging to resolve the target signal from noise. If the inferred noise floor does not reach the threshold noise floor, the method proceeds to 1406 to continue SDA operation at the current noise floor. If the inferred noise floor does reach or exceed the threshold, the method continues to 1408 to display an alert on a user interface, such as a screen or monitor at a system head end or a remote user device. In some examples, operation of the SDA 102 may be suspended until mitigating actions are performed.

Figure 15:
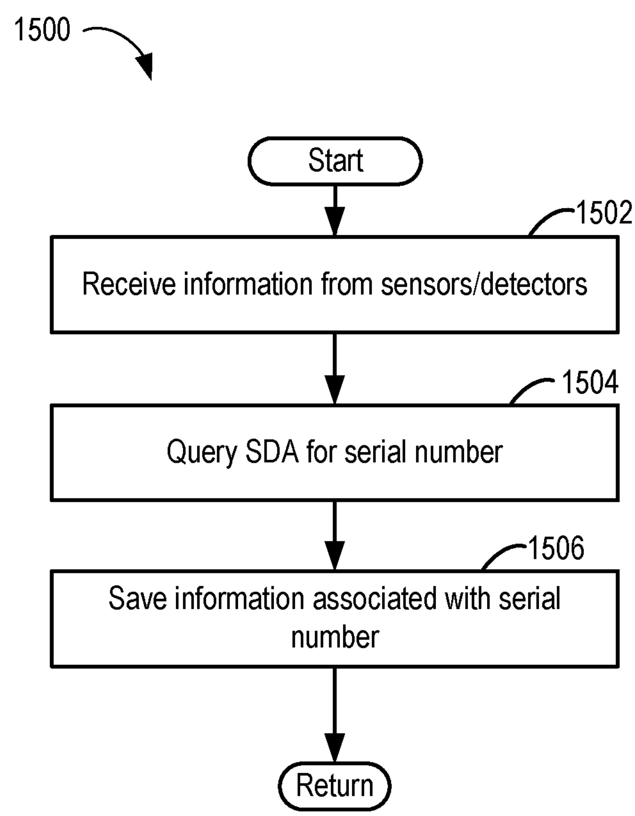
FIG. 15 is an example of a method for SDA identification.

An example of a method 1500 for identifying the SDA 102 by the amplifier identification module 816 of FIG. 8 is shown in FIG. 15. Method 1500 may be implemented by an SDA microcontroller communicating with a processor at a system head end, such as the system head end 120 of FIG. 1. At 1502, method 1500 includes transmitting information, collected by the SDA microprocessor from sensors and/or detectors of the SDA 102, to the system head end processor. The information may include operating parameters such as a voltage, switching signal power level, attenuation level, etc. of the SDA 102. At 1504, the method includes querying the SDA microcontroller for a serial number identifying the specific SDA 102 from which the information is collected. At 1506, the information is saved in a memory of the system head end processor associated with the serial number of the SDA 102.

Returning to FIG. 1, the SDA logic subsystem 104 may be upgraded over time with new firmware or software applications. Such upgrades may be performed from remote user device 140 through remote network 170, or from the system head end 120. An upgrade or change to the SDA logic subsystem 104 may also be made by physically changing hardware components of a SDA 102, or by making programming language changes directly to a SDA 102.

The SDA logic subsystem 104 may make decisions in response to signals or information sent by a technician at the system head end 120 or from the remote user device 140, or from a conductor of the train 160. For example, a technician may send a request for information about a system status, such as a switching state of the SDA 102, and the SDA logic subsystem 104 may process the request and respond with a signal or information providing a response.

The SDA logic subsystem 104 may also make decisions automatically responsive to preset instructions. These decisions may be related to information received from other radio communications system 100 components, from information received from other SDAs 102, or from information received from the SDA 102 that the SDA logic subsystem 104 is embedded within. The SDA logic subsystem 104 may also react to preset stimuli such as lengths of time. For example, the SDA logic subsystem 104 may send a second signal to the system head end 120 and/or the remote user device 140 after a predetermined time after receiving a first signal. Similarly, the SDA logic subsystem 104 may have preset executable instructions to send a signal to the system head end 120 and/or the remote user device 140 when a temperature of the SDA 102, for example, as measured by a temperature sensor, surpasses a predetermined threshold. As such, a likelihood of thermal degradation to the SDA 102 is reduced. In one embodiment, the SDA logic subsystem 104 accumulates data over a span of time and subsequently sends the data to the system head end 120 or to the remote user device 140 at certain predetermined time intervals. Such data may include information about SDA 102 performance and characteristics.

SDA 102 may include a SDA communication subsystem 106 that is configured to communicatively couple the SDA 102 with one or more other computing or electronic devices, such as system head end 120, remote user device 140, train 160, and one or more other SDAs 102. SDA communication subsystem 106 may include wired and/or wireless communication devices compatible with one or more different communication protocols. As non-limiting examples, SDA communication subsystem 106 may be configured for communication via a wireless telephone network, a wireless local area network, a wired local area network, a wireless wide area network, a wired wide area network, etc.

In some embodiments, SDA communication subsystem 106 may allow the SDA 102 to send and/or receive messages to and/or from other devices via a network such as remote network 170 or intra-tunnel network 180. In some examples, remote network 170 may be the public Internet. Furthermore, remote network 170 may be regarded as a private network connection and may include, for example, a virtual private network or an encryption or other security mechanism employed over the public Internet. In some embodiments, SDA communication subsystem 106 may allow the SDA 102 to send and/or receive messages to and/or from other devices via a network such as intra-tunnel network 180. Intra-tunnel network 180 may include RF frequencies conventionally used by trains to receive and send signals. The intra-tunnel network 180 may also include other types of wireless communication protocols including types of digital signal protocols.

SDA 102 may also include an SDA amplification subsystem 108. SDA amplification subsystem 108 provides amplification for signals received and/or sent by SDA 102. SDA amplification subsystem 108 may comprise various hardware components such as amplifiers, attenuators, band pass filters, and switches. SDA amplification subsystem 108 may be electronically connected to SDA logic subsystem 104 and SDA communication subsystem 106. Through these electronic connections, SDA amplification subsystem 108 may send and/or receive information to and/or from SDA logic subsystems 104 and SDA communication subsystem 106. SDA amplification subsystem 108 may include sensors and/or various detectors such as switching signal detectors 426 as shown in FIG. 4. SDA amplification subsystem 108 is described in more detail in FIG. 5.

Radio communications system 100 also includes system head end 120, which may include hardware and software receiving data streams through the radio communication system 100. For example, system head end 120 may be a master facility configured to process and distribute radio signals across the radio communication system 100. In some examples, system head end 120 may be a terminal station which may be adjusted, operated and/or monitored by a technician. System head end 120 may be located at or near an installation site of SDA 102. System head end 120 may be electronically coupled with at least one SDA 102 so that commissioning, monitoring, and/or control of at least one SDA 102 may be performed at system head end 120. System head end 120 may include head end (HE) logic subsystem 122. HE Logic subsystem 122 may include both hardware and software components.

HE logic subsystem 122 may include one or more microcontrollers or processors configured to execute software instructions and/or commands input manually. Additionally or alternatively, HE logic subsystem 122 may include one or more hardware or firmware logic machines configured to execute hardware, firmware, and manual instructions. Processors of HE logic subsystem 122 may be single or multicore, and the preset instructions executed thereon may be configured for parallel or distributed processing.

HE logic subsystem 122 may include software applications in addition to firmware. HE logic subsystem 122 may decode information received from an SDA 102 or from a remote user device 140. HE logic subsystem 122 may also encode information sent to other components of radio communications system 100. HE logic subsystem 122 may comprise one or multiple computer-related languages including machine languages and programming languages. HE logic subsystem 122 may be upgraded with different firmware or software applications. Such upgrades may be performed from a remote user device 140 through remote network 170, or on-site at the location of system head end 120. An upgrade to HE logic subsystem 122 may also be made by physically changing hardware components.

System head end 120 may also include head end (HE) display subsystem 124. HE display subsystem 124 may include a monitor, screen, or similar device that provides a visual representation of information. The visual representation may include numbers, words, charts, graphs, and other methods of conveying information. The information may be real-time information such as a current SDA 102 switching state at the time of viewing. The information may also comprise historical data such as SDA 102 downlink power levels over a time span such as 1 hour, 24 hours, 1 month or other time span. HE display subsystem 124 may also show messages sent from and/or to remote user device 140.

System head end 120 may also include head end (HE) control subsystem 126. HE control subsystem 126 allows manual interaction with SDA 102. The interaction may include monitoring and/or control of SDA 102. Information received when monitoring SDA 102 from system head end 120 may be depicted by HE display subsystem 124. For example, a first technician 502 as shown depicted in FIG. 5, may use HE control subsystem 126 to communicate electronically with SDA 102 to monitor the switching state of SDA 102. In one example and described below, in monitoring the switching state, a switching signal power level may be monitored. The first technician 502 may manually input into the HE control subsystem 126 a request for SDA 102 to provide information regarding the switching state or the switching signal power level. HE control subsystem 126 may transfer the manually input commands to HE logic subsystem 122, which may translate the commands into a digital signal that is then sent by head end (HE) communication subsystem 128 (described below) to SDA 102. The digital signal may be received by SDA communication subsystem 106, and analyzed by SDA logic subsystem 104. SDA logic subsystem 104 may provide a response based on preset executable logic algorithms, and send the requested information back via SDA communication subsystem 106. The requested information is received by HE communication subsystem 128, decoded by HE logic subsystem 122, and displayed by HE display subsystem 124.

In one embodiment, a switching signal power level is greater when SDA 102 is in one switching state versus another switching state, and may be used to determine the switching state of SDA 102. Non-limiting examples of the difference in the switching power level may be changes at or more than 30 decibels. In some examples, the difference in the switching power may be a large factor, such as a factor of 1000 times greater.

In one embodiment, the SDA logic subsystem 104 is configured to provide information regarding the switching state of the SDA 102 upon receiving a request for the information that is input into the HE control subsystem 126. Additionally or alternatively, the switching state may be determined to a high level of confidence, such as a 95% confidence level or higher, based on a determination of the switching signal power level or the difference in the switching signal power level.

For example, information received from SDA 102 regarding a switching signal power level, and information received from SDA 102 regarding the switching state, may be used in combination to determine switching state and/or verify SDA 102 is functioning correctly. Automated determination and identification of switching signal power level and/or switching state may provide alerts or other information to technicians. In some examples, verification of switching signal power level and/or switching state may be triggered through an automatic system or query system based on the determination. Verification of the reported strength of a switching signal may be confirmed to correspond with the expected strength of a switching signal power level when SDA 102 is in the reported switching state. If the reported switching signal power level is different from the expected power level for the reported switching state, additional alerts or triggers may indicate a changed condition. In some examples, technicians may verify or confirm the status condition of the SDA 102.

System head end 120 may also include a HE communication subsystem 128. HE communication subsystem 128 may be configured to communicatively couple system head end 120 with SDA 102, and/or with one or more other computing or electronic devices, such as remote user device 140. HE communication subsystem 128 may include wired and/or wireless communication devices compatible with one or more different communication protocols. As non-limiting examples, HE communication subsystem 128 may be configured for communication via a wireless telephone network, a wireless local area network, a wired local area network, a wireless wide area network, a wired wide area network, etc. In some embodiments, HE communication subsystem 128 may allow SDA 102 to send and/or receive messages to and/or from a remote user device 140 via remote network 170.

System head end 120 may also include head end (HE) data-holding subsystem 130. HE data-holding subsystem 130 includes one or more physical, non-transitory devices configured to hold data and/or instructions executable by HE logic subsystem 122 to implement herein described methods and processes. When such methods and processes are implemented, the state of HE data-holding subsystem 130 may be transformed (for example, made to hold different data).

HE data-holding subsystem 130 may include removable media and/or built-in devices. HE data-holding subsystem 130 may include optical memory (for example, CD, DVD, HD-DVD, Blu-Ray Disc, etc.), and/or magnetic memory devices (for example, hard drive disk, floppy disk drive, tape drive, MRAM, etc.), and the like. HE data-holding subsystem 130 may include devices with one or more of the following characteristics: volatile, nonvolatile, dynamic, static, read/write, read-only, random access, sequential access, location addressable, file addressable, and content addressable. In some embodiments, HE logic subsystem 122 and HE data-holding subsystem 130 may be integrated into one or more common devices, such as an application-specific integrated circuit or a system on a chip.

The HE data-holding subsystem 130 includes one or more physical, non-transitory devices. In addition, in some embodiments aspects of the invention described herein, data may be stored in remote servers and not held by a physical device at the system head end 120 for at least a finite duration.

Radio communications system 100 may also include remote user device 140. Remote user device 140 may be located at a different location than system head end 120. Non-limiting examples include distances such as 1, 100, or 1,000 miles away from system head end 120. In some examples, remote user device 140 may be a handheld device or a mounted device operated by a technician. Remote user device 140 may be inside a building, or on the person of a technician, such as a second technician 506 shown in FIG. 5, at a remote distance from the system head end 120. Remote user device 140 may remotely monitor and control SDA 102. For example, the second technician 506 of FIG. 5 may use remote user device 140 to control the switching state of SDA 102 from a distant location through remote network 170. Similarly, remote user device 140 may be used to monitor the temperature of SDA 102. To provide these functionalities, remote user device 140 may comprise multiple subsystems, such as remote user device (RD) logic subsystem 142, RD display subsystem 144, RD control subsystem 146, RD communication subsystem 148, and RD data-holding subsystem 150.

RD logic subsystem 142, which may be part of remote user device 140, may include one or more microcontrollers or processors configured to execute software instructions. Additionally or alternatively, RD logic subsystem 142 may include one or more hardware or firmware logic machines configured to execute hardware or firmware instructions. Processors of RD logic subsystem 142 may be single or multi-core, and the preset instructions and algorithms executed thereon may be configured for parallel or distributed processing.

RD logic subsystem 142 may also include software applications, in addition to firmware, and both software and firmware may be upgradable. RD logic subsystem 142 may decode information received from SDA 102 or from system head end 120. RD logic subsystem 142 may also encode information sent to other components of radio communications system 100. RD logic subsystem 142 may comprise one or multiple computer-related languages including machine languages and programming languages.

Remote user device 140 may also include remote user device (RD) display subsystem 144. RD display subsystem 144 may include a monitor, screen, or similar device that provides a visual representation of information. The visual representation may include numbers, words, charts, graphs, and other methods of conveying information. The information may be real-time information such as a current SDA 102 switching state at the time of viewing. The information may also comprise historical data such as SDA 102 downlink power levels over a time span such as 1 hour, 24 hours, 1 month or other time span. RD display subsystem 144 may also show messages sent from and/or to system head end 120.

Remote user device 140 may include remote user device (RD) communication subsystem 148. RD communication subsystem 148 may be configured to communicatively couple remote user device 140 with one or multiple SDAs 102, or with one or more other computing or electronic devices, such as system head end 120. RD communication subsystem 148 may include wired and/or wireless communication devices compatible with one or more different communication protocols. As non-limiting examples, RD communication subsystem 148 may be configured for communication via the wireless telephone network, the wireless local area network, the wired local area network, the wireless wide area network, the wired wide area network, etc. In some embodiments, RD communication subsystem 148 may allow remote user device 140 to send and/or receive messages to and/or from other devices via a network such as remote network 170.

RD data-holding subsystem 150 may be included in remote user device 140. RD data-holding subsystem 150 includes one or more physical, non-transitory devices configured to hold data and/or instructions executable by RD logic subsystem 142 to implement the herein described methods and processes. When such methods and processes are implemented, the state of RD data-holding subsystem 150 may be transformed (for example, configured to hold different data).

RD data-holding subsystem 150 may include removable media and/or built-in devices. RD data-holding subsystem 150 may include optical memory (for example, CD, DVD, HD-DVD, Blu-Ray Disc, etc.), and/or magnetic memory devices (for example, hard drive disk, floppy disk drive, tape drive, MRAM, etc.), and the like. RD data-holding subsystem 150 may include devices with one or more of the following characteristics: volatile, nonvolatile, dynamic, static, read/write, read-only, random access, sequential access, location addressable, file addressable, and content addressable. In some embodiments, RD logic subsystem 142 and RD data-holding subsystem 150 may be integrated into one or more common devices, such as an application-specific integrated circuit or a system on a chip.

RD data-holding subsystem 150 includes one or more physical, non-transitory devices. In addition, in some embodiments, the RD data-holding subsystem 150 may hold data in a remote location and the data is not held by a physical device within, or electronically connected to the RD data-holding subsystem 150, for at least a finite duration.

HE and RD display subsystems 124 and 144, respectively, may be used to present visual representation of data held by RD data-holding subsystem 150. As the herein described methods and processes change the data held by RD data-holding subsystem 150, and thus transform the state of RD data-holding subsystem 150, the state of HE and RD display subsystems 124 and 144, respectively, may likewise be transformed to visually represent changes in the underlying data. HE and RD display subsystems 124 and 144, respectively, may include one or more display devices utilizing virtually any type of technology. Such display devices may be combined with the HE and RD logic subsystems and/or RD data-holding subsystem 150 in a shared enclosure, or such display devices may be peripheral display devices.

Figure 2:
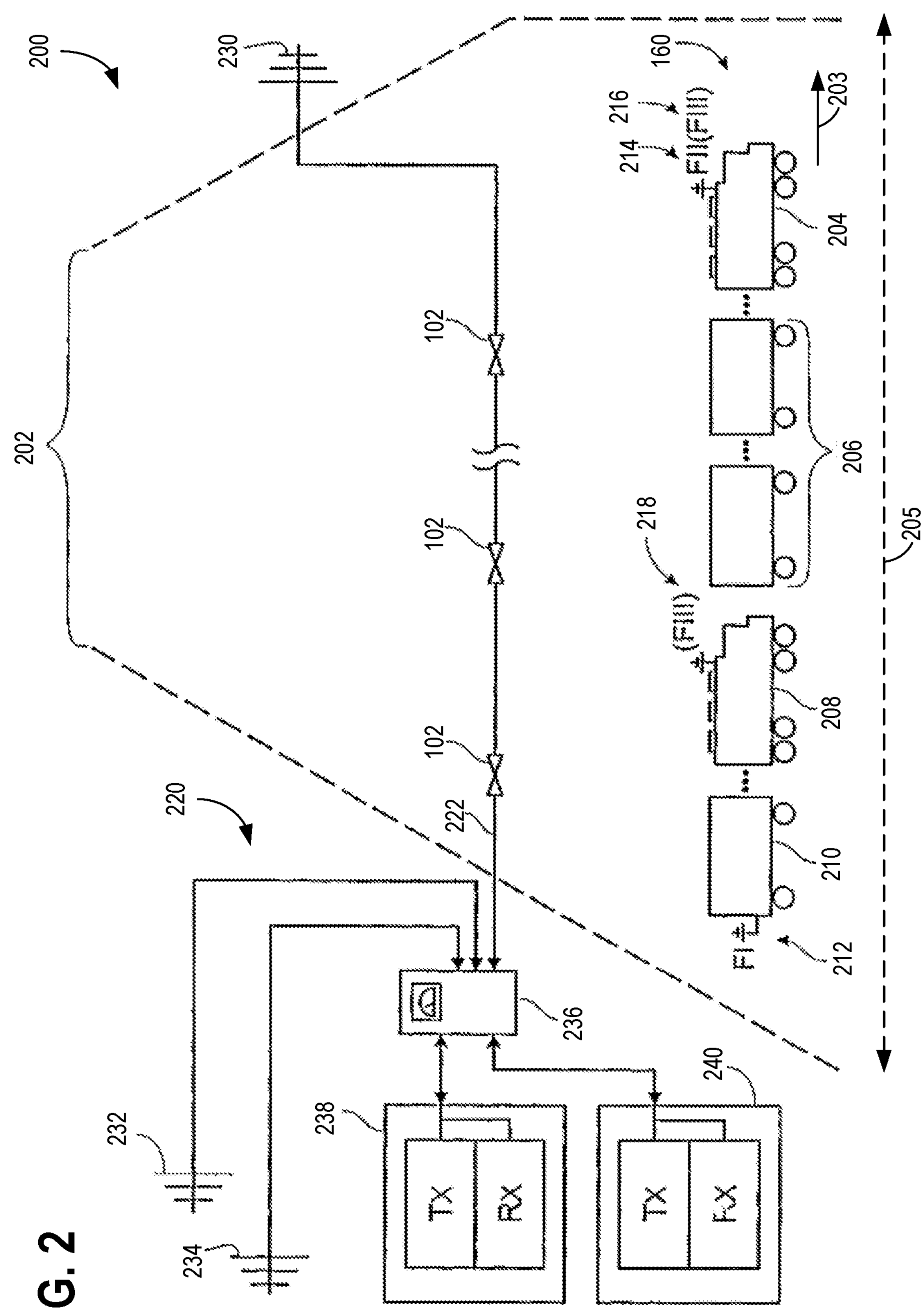
FIG. 2 is a schematic diagram of an onsite tunnel monitoring system with software-defined amplifiers (SDAs).

Radio communications system 100 may include train 160. Train 160 may be a locomotive, travelling along a rail track, or another type of vehicle. Train 160 may be a passenger-carrying vehicle or a freight-carrying vehicle. Train 160 may by controlled by a conductor within a lead locomotive 204 as shown in FIG. 2, by a remote conductor, or train 160 may be fully autonomous. Train 160 may also be a vehicle used to test the operation of radio communications system 100.

Train 160 may include train (TR) tunnel navigation subsystem 162, which allows train 160 to interact with radio communications system 100. TR tunnel navigation subsystem 162 may include TR logic subsystem 164, TR communication subsystem 168, and/or TR display subsystem 166. TR tunnel navigation subsystem 162 is described in more detail in the description of FIG. 2.

Turning now to FIG. 2, a tunnel monitoring system 200 is shown. The tunnel monitoring system 200 includes components of radio communications system 100 such as SDA 102, system head end 120, remote user device 140, and train 160. Tunnel monitoring system 200 depicts a schematic of components of radio communications system 100 as situated relative to train 160 and a shielded environment, e.g., a structure enclosing train 160 which may block radio frequency electromagnetic radiation, such as tunnel 202, which is navigated by train 160. For example, tunnel monitoring system 200 also includes an antenna subsystem 220 which may be communicatively coupled to one or more of the SDA 102, the system head end 120, and the remote user device 140.

First, a configuration of train 160 is described. Train 160 includes a head, or control, locomotive 204, which may carry operations personnel such as engineers and firemen. A first set of rolling stock cars 206 is located aft, relative to a direction of travel indicated by arrow 203, of head locomotive 204. A support locomotive 208 may be located between terminal ends of train 160 to provide additional tractive force to drive motion of train 160. A second set of one or more rolling stock cars 210 is arranged between support locomotive 208 and the end of train 160. In some instances, train 160 may include six or more locomotives and a hundred or more rolling stock cars. In some embodiments, more than one support locomotives 208 may be coupled directly to control locomotive 204.

TR navigation subsystem 162 may be implemented in train 160 and includes End-of-Train (EOT) device 212 at a trailing end of train 160, which may be a radio frequency communication device configured with TR communication subsystem 168 of FIG. 1, adapted to send a first status signal of the train 160 at a first predetermined interval, and receive a second status signal. As an example, the first status signal may indicate a location of the trailing end of train 160 relative to tunnel 202. Head-of-Train (HOT) device 214 is located in lead locomotive 204 at a front end of train 160, and may also be a radio frequency communication device configured with TR communication subsystem 168 of FIG. 1, adapted to send a second status signal at a second, less frequent, predetermined interval and receive the first status signal from EOT device 212. As an example, the second status signal may indicate a location of a front end of train 160 relative to tunnel 202.

EOT and HOT devices 212, 214, each comprise a data transceiver. EOT device 212 transmits a signal which is received in open space by HOT device 214 mounted in lead locomotive 204, and may be monitored by the engineers in the control locomotive 204. HOT device 214 transmits a less frequent message back to EOT device 212. When train 160 is in a tunnel environment, such as depicted tunnel 202, without a communication system such as tunnel monitoring system 200, the signal may blocked or shielded from transmitting/receiving at the EOT and HOT device 212, 214.

To control support locomotive 208, there may be, in lead locomotive 204, a first control unit 216 including an encoder (for encoding control input signals for the control locomotive 204) and a control transmitter (for transmitting an encoded control signal generated from the encoded control input signal). Each support locomotive 208 includes therein a second control unit 218, formed of a control receiver and a control decoder. The control receiver of the second control unit 218 receives the encoded control signal while the control decoder of the second control unit 218 decodes the encoded control signal into a control input signal that is used to control support locomotive 208.

Tunnel monitoring system 200 includes an antenna subsystem 220, configured to receive and send RF signals. Antenna subsystem 220 includes a radiating coaxial cable 222, which is disposed along a length 205 of tunnel 202 and extends beyond either end thereof. Cable 222 is "leaky," e.g., cable 222 allows the RF signals carried therealong to radiate therefrom so as to be received by the various receivers in the system. Cable 222 may be manufactured with a ribbed surface to promote the RF leakage effect, or cable 222 may be conventional coaxial cable that is equipped with a RF leak-promoting device along a length of cable 222, the length of cable 222 parallel with the length 205 of tunnel 202. In-line, bi-directional SDAs 102 are provided, in a preferred embodiment, at, for example, 1,000 foot intervals, along the length of coaxial cable 222 to maintain a high signal level throughout the length of tunnel 202. A first UHF antenna 230 may be located outside of one end of tunnel 202, while second and third UHF antennas 232 and 234, respectively are located outside an opposite end of tunnel 202. Second and third antennas 232, 234 may be connected to an interface unit 236, which in turn may be connected to a monitoring store-and-forward repeater 238 and a control store-and-forward repeater 240. Interface unit 236 connects directly to antenna ports in store-and-forward repeaters 238, 240, each of which has a receiver portion (Rx) and a transmitter portion (Tx). Antenna subsystem 220 may be an active, or distributed, antenna system. Antenna subsystem 220 of the present disclosure is operable to transmit both data and voice signals.

Bi-directional, in-line SDAs 102, which are spaced apart at intervals along coaxial cable 222, provide an amplification, e.g., an increase in intensity, for the RF signal carried through cable 222 that enables both monitoring and control of radio communications system 100 during operation. Bi-directional, in-line SDAs 102 provide automatic switching, e.g., transitioning between operations as shown in FIG. 4, to allow a signal to pass therethrough upon receipt of an appropriate signal. Coupling of interface 236 with bi-directional, in-line SDAs 102 may be accomplished with one store-and-forward repeater 238 for monitoring capabilities and one store-and-forward repeater 240 for controlling tunnel monitoring system 200.

Figure 3:
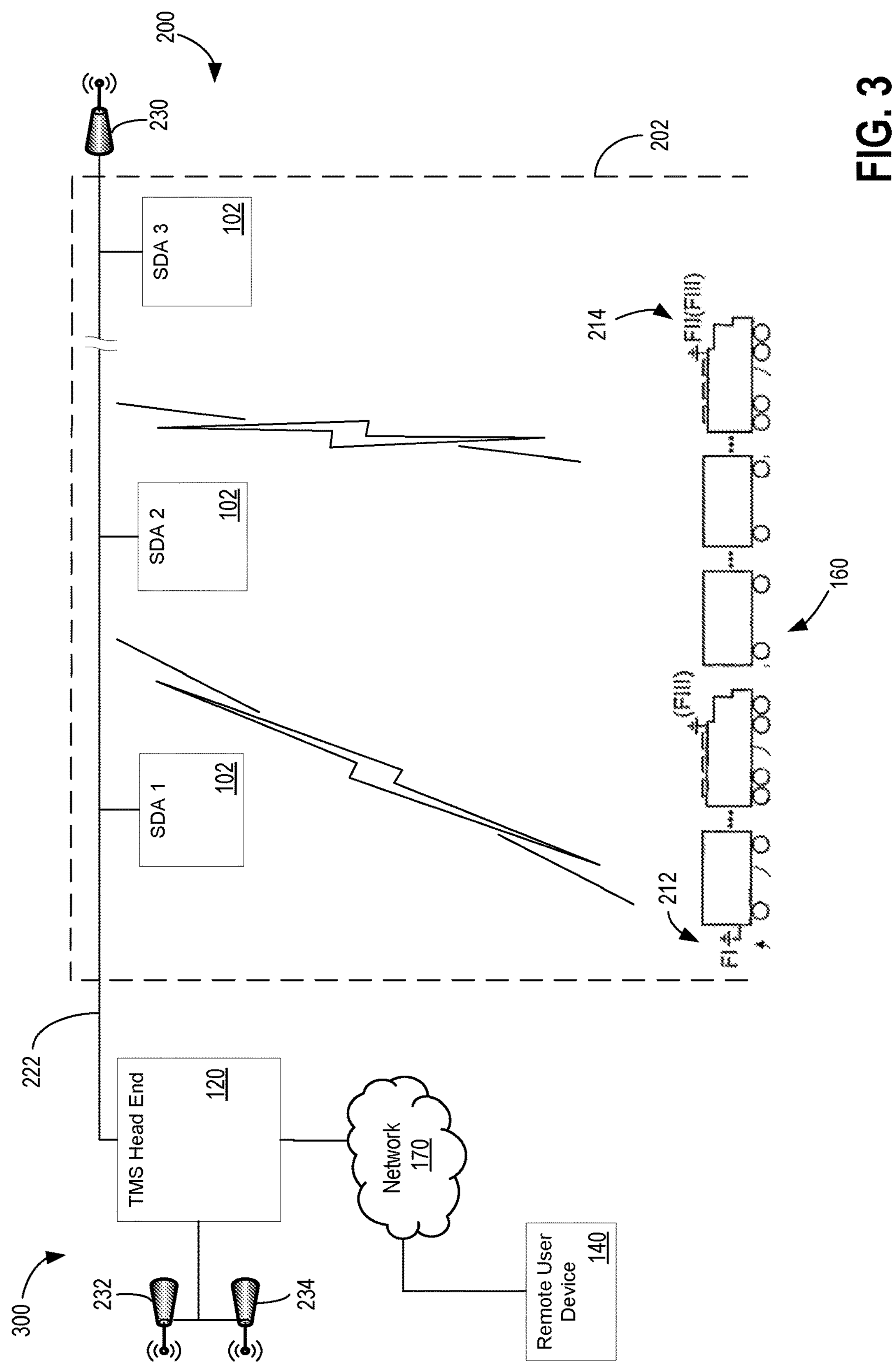
FIG. 3 is a simplified schematic of an onsite tunnel monitoring system.

Turning now to FIG. 3, a schematic diagram 300 depicts an embodiment of radio communications system 100 showing communication between both remote user device 140 and train 160, and tunnel monitoring system 200. As shown in FIG. 3, system head end 120 is connected through remote network 170 with remote user device 140. System head end 120, in turn, is in communication with UHF antennas 230, 232, 234 through radiating coaxial cable 222. System head end 120 is also in communication with multiple SDAs 102, also through cable 222. Remote user device 140 is further in communication with both SDAs 102 and UHF antennas 230, 232, 234 via remote network 170 linking remote user device 140 with system head end 120.

FIG. 3 also shows train 160 navigating tunnel 202. Train 160 has an EOT device 212 and a HOT device 214. Radiating coaxial cable 222 is designed to communicate with EOT device 212 and HOT device 214 of train 160. While travelling through tunnel 202, EOT device 212 may send a signal that is received by coaxial cable 222. The signal from EOT device 212 may then be transmitted along cable 222, and received and amplified by the SDAs 102. The signal may also be transmitted to antennas 230, 232, 234. In addition, the signal may be transmitted to system head end 120 and through remote network 170 to remote user device 140. The signal may be emitted by radiating coaxial cable 222, and subsequently received by HOT device 214 of train 160.

Similarly, HOT device 214 may send a second signal that is received by radiating coaxial cable 222. The second signal may be transported to and amplified by any one or multiple SDAs 102. The second signal is relayed along cable 222 to SDAs 102, to the antennas 230, 232, 234, and to system head end 120. From system head end 120, the signal may be transmitted through remote network 170 to remote user device 140. When such a second signal is received by cable 222, the second signal may then be emitted by cable 222 to be subsequently received by EOT device 212.

Although not depicted in FIG. 3, signals sent by the first control unit 216, as shown in FIG. 2, on the control locomotive 204 may also be received by coaxial cable 222. Such a signal may be transmitted along cable 222 to any SDA 102 and amplified by any SDA 102, and subsequently emitted by cable 222 and received by the second control unit 218 located on support locomotive 208 of FIG. 2. The signal sent by the control encoder and control transmitter of the first control unit 216 may also be transmitted along cable 222 to antennas 230, 232, and 234, and to system head end 120 and further through remote network 170 to remote user device 140. All signals of any type arriving at remote user device 140 may be logged, e.g., stored in a memory of the remote user device 140, and characteristics related to the signal, such as signal power level, may be logged, in RD data-holding subsystem 150 of FIG. 1.

Turning now to FIG. 4, software-defined amplifier (SDA) 102 is described in greater detail. SDA 102 operates under the control of software with no operator intervention. Software enables a transition from one configuration to another without downtime, by automatically calculating a set of state changes between one configuration and another and enabling an automated transition step between each step, thus achieving the change via software.

First, the path of an uplink signal will be described. A signal may be transmitted from train 160 and may include a signal from an EOT device 212, HOT device 214, or first control unit 216 of FIG. 2. For example, an airborne RF signal may be received from a set of signals 402 transmitted by train 160. The signal is received and routed at first switch 404. The signal then passes through first band pass filter 406. Next, the signal passes through uplink variable attenuator 408. Then the signal passes through uplink amplifier 410. As the signal progresses toward second switch 414, the signal is detected by uplink level detector 412. Uplink level detector 412 detects the strength of the signal and sends information regarding the signal strength to the microcontroller 424. The signal then reaches second switch 414 where the signal is routed to radiating cable 222 that runs along the length of the tunnel.

Now, a path of a downlink signal is described. The downlink signal may be a signal that was previously an uplink signal that was routed as described and which traveled first through another SDA 102. The downlink signal arrives at second switch 414 from radiating cable 222. On its way to second switch 414, the signal passes switching signal detector 426 that detects the switching signal's strength. Information regarding the switching signal's strength is sent to microcontroller 424. When the signal arrives at second switch 414, the signal is routed through downlink bandpass filter 416. Next, the signal travels through downlink variable attenuator 418. Then the signal moves through downlink amplifier 420 and flows to first switch 404. Between downlink amplifier 420 and first switch 404, the signal is detected by downlink signal detector 422. Information about the downlink signal level is sent to the microcontroller 424. The downlink signal passes through first switch 404 and may progress to another SDA 102. Additionally, or alternatively, the signal may be emitted by the SDA 102 to join the set of airborne signals 402 traveling between SDA 102 and train 160.

Microcontroller 424 is designed to receive information such as the downlink signal level, the uplink signal level, and the switching signal level. Microcontroller 424 receives such information and processes the information independently, without human interference. After processing the received information, microcontroller 424 sends corresponding commands to downlink variable attenuator 418, uplink variable attenuator 408, and the switch control (not shown). Microcontroller 424 may be preset with executable instructions to issue certain commands in response to receiving certain information. For example, microcontroller 424 may be preset with executable instructions to respond to information regarding uplink signal power level by issuing commands to adjust the settings of the uplink variable attenuator 408. Microcontroller 424 executable instructions and algorithms may be configured as firmware and software applications. Microcontroller 424 preset instructions may be updated or changed remotely through remote network 170 or on-site at system head end 120.

Microcontroller 424 is in communication with tunnel monitoring system (TMS) Radio 428 such that digital information may be passed back and forth between them. TMS Radio 428 comprises hardware and software that enables communication to be sent and received by tunnel monitoring system 200. The information may include monitoring and control information. TMS Radio 428 also communicates through TMS RF 402, which comprises the set of airborne RF signals transmitted by SDA 102 and train 160. As such, TMS Radio 428 may be communicatively coupled to one or more of the system head end 120 and the remote user device 140 of FIG. 1.

SDA 102 is configured to allow a variety of monitoring operations. In one example, information such as information regarding both downlink gain level and uplink gain level is transmitted to either or both of a system head end 120 and a remote user device 140. Similarly, SDA 102 may monitor power levels such as peak downlink power output and switching signal RF input power. SDA 102 may also monitor voltages including downlink and uplink RF detector voltages and a DC voltage. SDA 102 may further monitor other characteristics such as downlink and uplink attenuator settings and downlink and uplink noise floors. Monitoring the downlink and uplink attenuator settings may enable adjustment of the attenuator to divert and dissipate at least some of an excess amount of power at SDA 102. The downlink and uplink noise floors may be monitored to infer a signal-to-noise ration of SDA 102 based on the noise floors. SDA temperature and unit serial number may be monitored to regulate heat produced at SDA 102 by conversion from electrical energy. System head end 120 and one or multiple remote user devices 140 may be sent monitoring data concurrently to allow monitoring capability at multiple locations simultaneously.

The software-defined amplifier 102 of the present disclosure is also configured to allow a variety of control capabilities. For example, SDA 102 may allow control of downlink and uplink gain levels, downlink and uplink attenuator settings, and an amplifier uplink/downlink setting. These controls may be enacted from either system head end 120 or from one or more remote user devices 140 via remote network 170.

Control of a system gain balance method 600 (depicted in FIG. 6) from system head end 120 is one example of a control procedure enabled by SDA 102. The system gain balance method 600 may include three steps and may be carried out by an onsite technician 502 at system head end 120. First, a leveling command may be executed at first SDA 102. Second, control repeater 240 may be keyed to send the command downstream. Third, steps 1 and 2 may be repeated for the remaining SDAs 102 in the system. A system gain balance method 600 is described in greater detail in FIG. 6.

Figure 5:
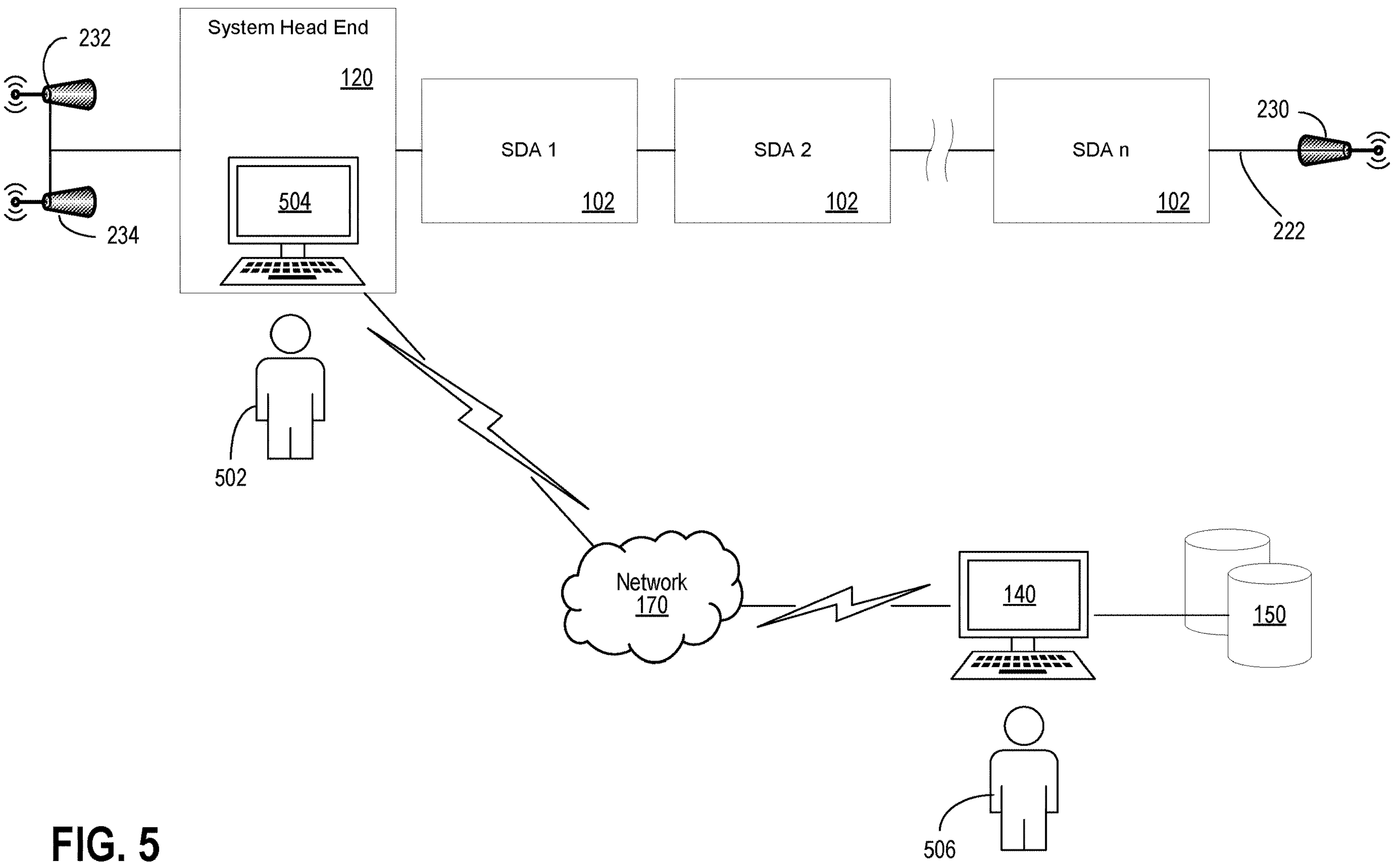
FIG. 5 is a schematic diagram showing technician interaction with the tunnel monitoring system.

FIG. 5 is a depiction of first and second technicians 502, 506 interacting with radio monitoring system 100. The figure shows the first technician 502, which may be an onsite technician 502, interacting with system head end interface 504. System head end interface 504 may include both HE display subsystem 124 and HE control subsystem 126. System head end interface 504 allows onsite technician 502 to monitor and or control one or more SDAs 102. For example, onsite technician 502 may use system head end interface 504 to monitor and set SDA 102 gain levels.

Onsite technician 502, when interacting with system head end interface 504, may be able to monitor downlink gain and uplink gain at system head end interface 504. Onsite technician 502 may also monitor switching signal RF input power, peak downlink output power, downlink RF detector voltage, and uplink RF detector voltage. Downlink attenuator setting, and uplink attenuator setting may also be monitored. Other system parameters and characteristics that may be monitored include downlink noise floor, uplink noise floor, SDA 102 temperature, a DC voltage, and SDA 102 unit serial number.

System head end 120 may also include HE data-holding subsystem 130 which may receive monitoring information and store monitoring information for later access. As a non-limiting example, HE data-holding subsystem 130 may hold information regarding system gain levels for 24 hours, 1 week, or for another length of time, or indefinitely.

System head end 120 may include HE logic subsystem 122, which may be designed to organize, correlate, and/or process information stored in HE data-holding subsystem 130. As a non-limiting example, HE logic subsystem 122 may be configured to show gain level data organized in terms of chronology, decreasing or increasing intensity, or other characteristic. Onsite technician 502 may use HE control subsystem 126 to request information such as SDA 102 uplink gain levels during specified timeframes. The request may be processed by HE logic subsystem 122, and the corresponding answer may be displayed by HE display subsystem 124.

Onsite technician 502, interacting with system head end interface 504, may also control aspects of SDA 102. Onsite technician 502 may use HE control subsystem 126 to input control commands that are processed by HE logic subsystem 122 and then sent by HE communication subsystem 128 to one or more SDAs 102. For example, onsite technician 502 may command an SDA 102 to increase downlink attenuation. As another example, onsite technician 502 may command at least one SDA 102 to set gain levels. The process of setting gain levels may include sending a message to control repeater 240, which subsequently sends a signal to an SDA 102 that tells an SDA 102 to initialize Automatic Gain Control (AGC) mode for a predetermined number of seconds. Onsite technician 502 may then send a message to the SDA 102 requesting that the SDA 102 responds with information regarding a gain level. The information sent by the SDA 102 in response to the query regarding gain level may be displayed by HE display subsystem 124.

FIG. 5 also shows second technician 506, which may be a remote technician 506, interacting with remote user device 140. Remote user device 140 may allow the same monitoring and control capabilities as system head end 120, or greater or lesser capabilities. In some embodiments, there are multiple remote user devices 140 with equal or differing capabilities, and used by multiple remote technicians 506 or the same remote technician 506.

As shown in FIG. 5, remote user device 140 is communicatively coupled with RD data-holding subsystem 150. Information regarding radio monitoring system 100 characteristics and performance may be store in RD data-holding subsystem 150. Information stored in RD data-holding subsystem 150 may be accessed by remote technician 506, or accessed by onsite technician 502.

Although FIG. 5 depicts remote network 170 connecting one system head end 120 and one remote user device 140, many connectivity options are actually available. For example, in one embodiment, system head end 120 may be communicatively coupled with multiple remote user devices 140. In one example, multiple system head ends 120 may be communicatively coupled with one remote user device 140. In another example, multiple system head ends 120 are connected by remote network 170 with multiple remote user devices 140 so that each system head end 120 and each remote user device 140 may communicate with any one or more other system head ends 120 and/or remote user devices 140. In addition, remote network 170 may or may not be connected or disconnected to various system head ends 120 and remote user devices 140 after system commissioning. For example, as a new system head end 120 is built, new system head end 120 may be connected to an existing remote network 170 that already communicatively couples one or more system head ends 120 and one or more remote user devices 140.

The access provided to radio monitoring system 100 by either system head end 120 or remote user device 140 may be utilized to upgrade, change, or replace firmware and/or software applications in SDA, HE, and RD logic subsystems 104, 122, 142. For example, remote technician 506 may install a software application in SDA 102 that modifies behavior of microcontroller 424. Remote technician 506 may use remote user device 140 to send the software application through remote network 170 to modify SDA 102. Similarly, remote technician 506 may cancel or delete a software application through remote network 170.

A method 600 for setting gain in a system including multiple SDAs, such as SDA 102 of FIGS. 1-5, arranged in series, is provided by FIG. 6. Method 600 shows an example method of controlling SDAs at a system head end, such as system head end 120 of FIG. 1. Method 600 may be performed by an onsite technician, such as onsite technician 502 of FIG. 5 interacting with a system interface, e.g., system head end interface 504 of FIG. 5. At 602, method 600 includes inputting a command at the system head end to set target power level and initiate AGC mode for a specified number of seconds. At 604, a control repeater, e.g., control repeater 240 of FIG. 2, receives the command and transmits the signal downstream (away from the control repeater) for a specified number of seconds. One SDA receives the command and enters AGC mode for a specified number of seconds at 606. At 608, using a repeater signal as a reference, the SDA adjusts output power to the specified target power level. AGC mode stops at 610 and SDA settings are saved by a SDA logic subsystem, such as SDA logic subsystem 104 of FIG. 1.

In addition to method 600 for setting gain outlined in FIG. 6, onsite technician 502 may, at 612, continue to method 700, as shown in FIG. 7, to verify that the SDA has successfully set gain to the predetermined target level. Method 700 of FIG. 7 determines if an SDA 102 has successfully set the gain level, thereby notifying a technician if a next downstream SDA is to be similarly set.

Turning now to FIG. 7, at 702, method 700 includes inputting a command into the system head end to request confirmation that the SDA has achieved the target power level. At 704, a SDA communication subsystem, such as the SDA communication subsystem 106 of FIG. 1, receives the command. At 706 an SDA logic subsystem, such as the SDA logic subsystem 104 of FIG. 1, decodes the command. The SDA logic subsystem then determines whether target power was achieved based on preset instructions at 708.

If the SDA logic subsystem at 708 determines that the target power was achieved, the method continues to 710 to encode a response. The SDA communications subsystem sends the response to the system head end at 712. At 714, the response is received at the system head end. After the response affirming that the target power was achieved is received by the system head end, method 600 begins for the next SDA 102 at 716.

If the SDA logic subsystem at 708 determines that the target power was not achieved, then the method proceeds to 718 where the SDA logic subsystem encodes a response. At 720, the SDA communications subsystem sends the response to the system head end. At 722, the system head end receives the response notifying that the target power level was not achieved. At 724, method 600 is initiated again for the same SDA 102. Alternatively, troubleshooting operations, such as diagnostic tests, may be implemented to determine why target power is not attained before beginning method 600 again.

In this way, a radio communication system for a train may be controlled remotely The radio communication system may include one or more software-defined amplifiers (SDAs) to increase an intensity of a radiofrequency signal as the train travels through a shielded tunnel. The SDAs may be coupled to a system head end via a wireless communication link, allowing operational parameters of the SDAs to be adjusted remotely. The remote control of the radio communication system enables adjustments to be made to the SDA parameters without imposing downtime on train operation or demanding manual manipulation of the SDAs, thereby increasing an efficiency of train operation.

In some embodiments, the amplifier of the present disclosure is an amplifier for use in a radio communications system used by a train transiting a tunnel, and comprises a microcontroller, with one or more processers, configured with executable instructions in a non-transitory memory that when executed by the microcontroller enables the amplifier to be operative to receive, using the one or more processors, a request for performance or system characteristics information from a system head end or a remote user device; determine, using the one or more processors, the requested information; transmit, using the one or more processors, the information to the system head and or the remote user device; receive, using the one or more processors, one of a set of commands from the system head end or the remote user device to change an amplifier status or performance characteristic; determine, using the one or more processors, the action that will enact the command; execute, using the one or more processors, the command; wherein the set of commands executable by one or more processors includes a command to set an amplifier gain level; wherein the amplifier is disposed along the length of a radiating coaxial cable and amplifies RF signals therein; wherein the microcontroller is configured with executable instructions in a non-transitory memory that when executed by the microcontroller enables the microcontroller to switch an amplifier switching state responsive to a switching signal in the cable; adjust an uplink or downlink attenuator setting responsive to an uplink or downlink signal power level in the cable; and wherein the amplifier is bi-directional.

In some embodiments, the set of commands received from the system head end or the remote user device comprises at least one of a command to set an uplink signal attenuation level, a downlink signal attenuation level, an uplink signal gain level, a downlink signal gain level, an amplifier switching state, and an amplifier voltage level. In some embodiments, the set of commands received from the system head end or the remote user device may include a switching signal power level command, specifically a command to set a switching signal power level.

In some embodiments, the information that the amplifier sends to the system head end or the remote user device comprises at least one of information about a signal gain level, a signal attenuation level, an uplink signal gain level, a downlink signal gain level, an amplifier switching state, a switching signal power level, an amplifier voltage level, an amplifier temperature, an uplink or downlink noise floor, and an amplifier unit serial number.

In one example, the radio communications system for use by trains in a tunnel comprises an antenna subsystem for receiving and sending RF signals. In one example, the antenna subsystem comprises a surface antenna located beyond the tunnel portals at either end thereof, a radiating coaxial cable located in and along the length of the tunnel, and at least one bi-directional amplifier disposed along the length of the cable and the amplifier amplifies RF signals therein. In some embodiments, the amplifier comprises a microcontroller, with one or more processers, configured with executable instructions in a non-transitory memory. In some embodiments, the executable instructions, when executed by the microcontroller, enable the amplifier to be operative to receive, using one or more processors, a request for information regarding performance or system characteristics from a system head end or a remote user device; to determine, using one or more processors, the requested information; and to transmit, using one or more processors, the information to the system head and or the remote user device. In some embodiments, the executable instructions, when executed by the microcontroller, enable the amplifier to receive, using one or more processors, one of a set of commands from the system head end or the remote user device to change an amplifier status or performance characteristic; determine, using one or more processors, the action that will enact the command; and execute, using one or more processors, the command; wherein the set of commands includes a command to set an amplifier gain level.

In some embodiments, the radio communications system further comprises a system head end comprising a user interface comprising a monitor and a control subsystem comprising one or more processors configured with executable instructions in a non-transitory memory. In some embodiments, the executable instructions, when executed by the one or more processors, enables the control subsystem to receive from the user interface a request for information regarding an amplifier status or performance characteristic; to encode the request into digital signals; to transmit the request to the amplifier; to receive the information from the amplifier; to decode the information received from the amplifier; and to display the received information on the monitor. In some embodiments, the executable instructions, when executed by the one or more processors, enable the control subsystem to receive a command for changing the status of an amplifier status or performance characteristic from the user interface; encode the command into digital signals; and transmit the command to the amplifier. In some embodiments, the radio communications system may further comprise a remote user device comprising a user interface comprising a monitor and a control subsystem comprising one or more processors configured with executable instructions in a non-transitory memory. In some embodiments, the executable directions, when executed by the one or more processors, enable the control subsystem is to receive from the user interface a request for information regarding an amplifier status or performance characteristic; to encode the request into digital signals; to transmit the request to the amplifier; to receive the information from the amplifier; to decode the received information from the amplifier; and to display the received information on the monitor. In some embodiments, the executable directions, when executed by the one or more processors, enable the control subsystem to receive one of a set of commands for changing an amplifier status or performance characteristic from the user interface; to encode the command into digital signals; and to transmit the command to the amplifier.

In some embodiments of the radio communications system, at least one of the system head end and the remote user device further comprises a tangible, non-transitory data storage device, and the stored data is accessible from a user interface at the system head end or the remote user device. In some embodiments a plurality of the amplifiers are disposed along the radiating coaxial cable. In some embodiments. In some embodiments, the radio communications system further comprises a monitoring store-and-forward repeater and a controlling store-and-forward repeater communicatively coupled with the radiating coaxial cable, and configured to repeat monitoring and controlling signals.

In some embodiments, the method of monitoring and controlling a train transiting a tunnel comprises monitoring, from a system head end or a remote user device, an amplifier disposed along, and amplifying RF signals therein, a radiating coaxial cable located in and along the length of a tunnel; wherein the amplifier comprises a microcontroller, with one or more processers, configured with executable instructions in a non-transitory memory that when executed by the microcontroller enables the amplifier to be operative to receive a request for information regarding an amplifier status or performance characteristic from a system head end or a remote user device; to determine the requested information; to transmit the information to the system head and or the remote user device; to receive one of a set of commands from the system head end or the remote user device to change an amplifier status or performance characteristic; to determine the action that will enact the command; to execute the command. In some embodiments, the set of commands includes a command to set an amplifier gain level.

In some embodiments, the system head end and remote user device each comprise a user interface and a control subsystem; wherein each of the user interfaces comprise a monitor; and wherein each of the control subsystems comprise one or more processors and a non-transitory memory configured with executable instructions to send requests for information about an amplifier performance or system characteristic, and to receive and display the requested information. In some embodiments, the executable instructions further comprise instructions to send a command for a status change in an amplifier status or performance characteristic.

In some embodiments, monitoring the amplifier comprises inputting a request for information regarding an amplifier status or performance characteristic into the user interface at either the system head end or the remote user device; encoding, with the one or more processors in the corresponding control subsystem, the request into digital signals, transmitting, with the one or more processors in the corresponding control subsystem, the request to the amplifier; receiving, with the microcontroller, the request at the amplifier; processing the request with the microcontroller in the amplifier; transmitting, with the microcontroller, the requested information to the control subsystem that transmitted the information request; decoding, with the one or more processors in the corresponding control subsystem, the requested information; displaying, with the one or more processors in the corresponding control subsystem, the requested information on the corresponding monitor.

In some embodiments, controlling the amplifier comprises inputting one of a set of commands for changing an amplifier status or performance characteristic into either the system head or the remote user device; encoding, with one or more processors in the corresponding control subsystem, the command into digital signals; transmitting the command to the amplifier; receiving, with the microcontroller, the command at the amplifier; determining, with the microcontroller, the action that will enact the command; and executing, with the microcontroller, the command.

In some embodiments, the set of commands further comprises at least one of a command to set an uplink signal attenuation level, a downlink signal attenuation level, an uplink signal gain level, a downlink signal gain level, an amplifier switching state, and an amplifier voltage level. As provided above, in some embodiments, the set of commands further may include a command to set a switching signal power level.

In some embodiments, the information regarding an amplifier status or performance characteristic includes at least one of information about a signal gain level, a signal attenuation level, an uplink signal gain level, a downlink signal gain level, an amplifier switching state, a switching signal power level, an amplifier voltage level, an amplifier temperature, an uplink or downlink noise floor, and an amplifier unit serial number.

In some embodiments, the amplifier microcontroller is configured with executable instructions in a non-transitory memory that when executed by the microcontroller enables the microcontroller to switch an amplifier switching state responsive to a switching signal in the cable; and to adjust an uplink or downlink attenuator setting responsive to an uplink or downlink signal power level in the cable.

In some embodiments, the method to control a gain level comprises inputting a command to set a target power level and initiate Automatic Gain Control (AGC) mode for a specific number of seconds into a user interface at the system head end; receiving the command in the control store-and-forward repeater; using the control store-and-forward repeater to transmit the command signal downstream for a specified number of seconds; receiving the command in the amplifier, thereby causing the amplifier to enter into AGC mode for a specified number of seconds; using the repeater signal as a reference, the amplifier adjusts output power to the specified level; and ending AGC mode and saving settings.

In some embodiments, the method to monitor a gain level comprises inputting a request for information regarding a power level into a user interface at the system head end; receiving the request for information in the amplifier; decoding, using one or more processors in the amplifier microcontroller, the request for information; determining, using one or more processors in the amplifier microcontroller, the appropriate response; encoding, using one or more processors in the amplifier microcontroller, the requested information; sending the information, using one or more processors in the amplifier microcontroller, to the system head end; and receiving the information at the system head end.

In one embodiment, a bi-directional amplifier for a radio communications system in a shielded environment includes one or more signal detectors positioned along a signal transmission path of the bi-directional amplifier, a microcontroller communicatively coupled to the one or more signal detectors and configured with executable instructions in a non-transitory memory, that, when executed by the microcontroller, enables the microcontroller to adjust operating parameters of the bi-directional amplifier, and a radio communicatively coupled to the microcontroller, the radio configured to receive and transmit information from a radio frequency monitoring system. In a first example of the amplifier, the executable instructions in the non-transitory memory of the microcontroller includes a plurality of modules, each module of the plurality of modules configured to control adjustment of one operating parameter of the bi-directional amplifier upon execution of the module by the microcontroller. A second example of the amplifier optionally includes the first example, and further includes, wherein the plurality of modules includes a gain control module, an attenuation control module, a switching state module, a switching signal control module, a voltage control module, a temperature monitoring module, a noise floor monitoring module, and an amplifier identification module. A third example of the amplifier optionally includes one or more of the first and second examples, and further includes, wherein each module of the plurality of modules includes hardware and software configured to control and report the operating parameter corresponding to the module. A fourth example of the amplifier optionally includes one or more of the first through third examples, and further includes, comprising switches, a downlink bandpass filter, downlink attenuator, a downlink amplifier, an uplink bandpass filter, an uplink attenuator, and an uplink amplifier, arranged in series along the signal transmission path and configured to be adjustable based on instructions received from the microcontroller. A fifth example of the amplifier optionally includes one or more of the first through fourth examples, and further includes, wherein the radio is coupled to the radio frequency monitoring system by a remote network linking the radio to a train, a remote user device, and a system head end of the radio frequency monitoring system. A sixth example of the amplifier optionally includes one or more of the first through fifth examples, and further includes, wherein the microcontroller is configured to receive instructions from the system head end and/or the remote user device by transmission of the instructions through the radio.

In another embodiment, a radio communication system includes at least one antenna arranged at an end of a tunnel through which the train navigates, a coaxial cable extending along a length of the tunnel and communicatively coupled to the at least one antenna, at least one software-defined amplifier (SDA) disposed along a length of the cable, and a remote network coupling the at least one antenna to a system head end and a remote user device of the radio communications system, the system head end configured to distribute radio frequency signals across the radio communications system, and wherein the SDA includes a processor configured with executable instructions stored in non-transitory memory that when executed, cause the processor to control and report power gain levels and control and report attenuation levels. In a first example of the system, the at least one antenna is configured to receive and transmit a radio frequency signal from the system head end and/or the remote user device and pass the signal through the coaxial cable. A second example of the system optionally includes the first example and further includes, wherein the coaxial cable is configured to radiate the radio frequency signal and wherein the at least one SDA is arranged in a transmission path of the radio frequency signal. A third example of the system optionally includes one or more of the first and second examples, and further includes, wherein the executable instructions further comprises instructions that cause the processor to control and report an SDA switching state, an SDA switching signal power level, an SDA voltage. A fourth example of the system optionally includes one or more of the first through third examples, and further includes, wherein the executable instructions further comprises instructions that cause the processor to monitor and report an SDA temperature, an SDA noise floor, and an SDA identification. A fifth example of the system optionally includes one or more more of the first through fourth examples, and further includes, wherein at least one of the system head end and the remote user device comprises a tangible, non-transitory data storage device configured to store data received from the at least one SDA and wherein the stored data is accessible from a user interface.

In yet another embodiment, a method includes receiving, at a processor in an amplifier of a radio communications system, a request for information from at least one of a plurality of modules, sending, with the processor in the amplifier, the requested information from at least one of the plurality of modules, receiving, at the processor in the amplifier, a command to vary a behavior of at least one of the plurality of modules, and varying, with the processor in the amplifier, the behavior of the at least one of the plurality of modules, wherein the plurality of modules includes executable instructions configured to enable, when executed by the processor, the processor to control and report amplifier gain level and control and report amplifier attenuation level. In a first example of the method, the plurality of modules further comprises executable instructions enabling the processor to control and report an amplifier switching state, control and report an amplifier switching signal power level, control and report amplifier voltage parameters, monitor and report an amplifier temperature, monitor and report a signal noise floor, and monitor and report an amplifier identity. A second example of the method optionally includes the first example, and further includes wherein receiving the request for information at the processor of the amplifier includes receiving the request at an antenna positioned at an end of the tunnel from at least one of a system head end or a remote user device via a remote network and transmitting the signal along a coaxial cable to which the amplifier is coupled. A third example of the method optionally includes one or more of the first and second examples, and further includes, wherein enabling the processor to control amplifier gain level includes inputting a command signal to set a target power level and initiate an Automatic Gain Control mode for a specified number of seconds at a user interface of the system head of the radio communications system, sending the command signal over the remote network to the antenna, the antenna transmitting information to a control store-and forward repeater, transmitting, by a processor in the control store-and-forward repeater, the command signal downstream in a transmission path of the amplifier for a specified number of seconds, receiving the command signal at the processor in the amplifier, adjusting the amplifier to the Automatic Gain Control mode for the specified number of seconds, referring to the command signal to adjust the amplifier output signal power to a target level, and saving settings of the amplifier into a non-transitory memory of the processor in the amplifier. A fourth example of the method optionally includes one or more of the first through third examples, and further includes, wherein controlling gain level further includes confirming the target level is attained by inputting a request for information regarding a signal power level at the user interface of the system head end, sending the request to the processor in the amplifier over the remote network, comparing the signal power level at the amplifier to the target level at the processor in the amplifier, sending the response from the processor in the amplifier to the system head over the remote network, and displaying the response on the user interface of the system head end. A fifth example of the method optionally includes one or more of the first through fourth examples, and further includes, wherein enabling the processor to control amplifier attenuation level includes receiving a signal from a train over a remote network of a radio communications system at a switch of the amplifier and transmitting the signal through a transmission path of the amplifier, the transmission path including a signal strength detector communicatively coupled to the processor in the amplifier. A sixth example of the method optionally includes one or more of the first through fifth examples, and further includes, wherein enabling the processor to report amplifier attenuation level includes sending information from the processor in the amplifier to a radio in the amplifier, the radio communicatively coupled to the processor and linked to a system head end of the radio communications system over the remote network.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A bi-directional amplifier for a radio communications system in a shielded environment, comprising;

one or more signal detectors positioned along a signal transmission path of the bi-directional amplifier;

a microcontroller communicatively coupled to the one or more signal detectors and configured with executable instructions in a non-transitory memory, that, when executed by the microcontroller, enables the microcontroller to adjust operating parameters of the bi-directional amplifier; and a radio communicatively coupled to the microcontroller, the radio configured to receive and transmit information from a radio frequency monitoring system;

wherein the executable instructions include a plurality of modules with hardware and software configured to control and report an operating parameter corresponding to a module; and wherein the plurality of modules includes a gain control module, an attenuation control module, a switching state module, a switching signal control module, a voltage control module, a temperature monitoring module, a noise floor monitoring module, and an amplifier identification module.

2. The bi-directional amplifier of claim 1, wherein each module of the plurality of modules is configured to control adjustment of one operating parameter of the bi-directional amplifier upon execution of the module by the microcontroller.

3. The bi-directional amplifier of claim 1, further comprising switches, a downlink bandpass filter, downlink attenuator, a downlink amplifier, an uplink bandpass filter, an uplink attenuator, and an uplink amplifier, arranged in series along the signal transmission path and configured to be adjustable based on instructions received from the microcontroller.

4. The bi-directional amplifier of claim 1, wherein the radio is coupled to the radio frequency monitoring system by a remote network linking the radio to a train, a remote user device, and a system head end of the radio frequency monitoring system.

5. The bi-directional amplifier of claim 4, wherein the microcontroller is configured to receive instructions from the system head end and/or the remote user device by transmission of the instructions through the radio.

6. A radio communication system for a train, comprising;
- at least one antenna arranged at an end of a tunnel through which the train navigates;
- a coaxial cable extending along a length of the tunnel and communicatively coupled to the at least one antenna;
- at least one software-defined amplifier (SDA) disposed along a length of the cable; and
- a remote network coupling the at least one antenna to a system head end and a remote user device of the radio communications system, the system head end configured to distribute radio frequency signals across the radio communications system, and wherein the SDA includes a processor configured with executable instructions stored in non-transitory memory that when executed, cause the processor to:
  - control and report power gain levels; and
  - control and report attenuation levels.

7. The radio communications system of claim 6, wherein the at least one antenna is configured to receive and transmit a radio frequency signal from the system head end and/or the remote user device and pass the signal through the coaxial cable.

8. The radio communications system of claim 7, wherein the coaxial cable is configured to radiate the radio frequency signal and wherein the at least one SDA is arranged in a transmission path of the radio frequency signal.

9. The radio communications system of claim 6, wherein the executable instructions further comprises instructions that cause the processor to:
- control and report an SDA switching state, an SDA switching signal power level, an SDA voltage.

10. The radio communications system of claim 6, wherein the executable instructions further comprise instructions that cause the processor to:
- monitor and report an SDA temperature, an SDA noise floor, and an SDA identification.

11. The radio communications system of claim 6, wherein at least one of the system head end and the remote user device comprises a tangible, non-transitory data storage device configured to store data received from the at least one SDA and wherein the stored data is accessible from a user interface.

12. A method of monitoring and controlling a train navigating a tunnel, comprising:
- receiving, at a processor in an amplifier of a radio communications system, a request for information from at least one of a plurality of modules;
- sending, with the processor in the amplifier, the requested information from at least one of the plurality of modules;
- receiving, at the processor in the amplifier, a command to vary a behavior of at least one of the plurality of modules; and
- varying, with the processor in the amplifier, the behavior of the at least one of the plurality of modules, wherein the plurality of modules includes executable instructions configured to enable, when executed by the processor, the processor to:
  - control and report amplifier gain level; and
  - control and report amplifier attenuation level.

13. The method of claim 12, wherein the plurality of modules further comprises executable instructions enabling the processor to:
- control and report an amplifier switching state;
- control and report an amplifier switching signal power level;
- control and report amplifier voltage parameters;
- monitor and report an amplifier temperature;
- monitor and report a signal noise floor; and
- monitor and report an amplifier identity.

14. The method of claim 12, wherein receiving the request for information at the processor of the amplifier includes receiving the request at an antenna positioned at an end of the tunnel from at least one of a system head end or a remote user device via a remote network and transmitting the signal along a coaxial cable to which the amplifier is coupled.

15. The method of claim 14, wherein enabling the processor to control amplifier gain level includes:
- inputting a command signal to set a target power level and initiate an Automatic Gain Control mode for a specified number of seconds at a user interface of the system head end of the radio communications system;
- sending the command signal over the remote network to the antenna, the antenna transmitting information to a control store-and-forward repeater;
- transmitting, by a processor in the control store-and-forward repeater, the command signal downstream in a transmission path of the amplifier for a specified number of seconds;
- receiving the command signal at the processor in the amplifier;
- adjusting the amplifier to the Automatic Gain Control mode for the specified number of seconds;
- referring to the command signal to adjust amplifier output signal power to a target level; and
- saving settings of the amplifier into a non-transitory memory of the processor in the amplifier.

16. The method of claim 15, wherein controlling gain level further includes confirming the target level is attained by:
- inputting a request for information regarding a signal power level at the user interface of the system head end;
- sending the request to the processor in the amplifier over the remote network;
- comparing the signal power level at the amplifier to the target level at the processor in the amplifier;
- sending a response from the processor in the amplifier to the system head end over the remote network; and
- displaying the response on the user interface of the system head end.

17. The method of claim 12, wherein enabling the processor to control amplifier attenuation levels includes receiving a signal from a train over a remote network of a radio communications system at a switch of the amplifier and transmitting the signal through a transmission path of the amplifier, the transmission path including a signal strength detector communicatively coupled to the processor in the amplifier.

18. The method of claim 17, wherein enabling the processor to report amplifier attenuation levels includes sending information from the processor in the amplifier to a radio in the amplifier, the radio communicatively coupled to the processor and linked to a system head end of the radio communications system over the remote network.

* * * * *